(12) United States Patent
Ashida et al.

(10) Patent No.: US 10,784,551 B2
(45) Date of Patent: Sep. 22, 2020

(54) BAND-PASS FILTER

(71) Applicant: TDK CORPORATION, Tokyo (JP)

(72) Inventors: Yuta Ashida, Tokyo (JP); Noriyuki Hirabayashi, Tokyo (JP); Shigemitsu Tomaki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 16/179,059

(22) Filed: Nov. 2, 2018

(65) Prior Publication Data

US 2019/0198959 A1  Jun. 27, 2019

(30) Foreign Application Priority Data

Dec. 26, 2017  (JP) ................ 2017-249867

(51) Int. Cl.
  *H01P 1/203*  (2006.01)
  *H03H 7/01*  (2006.01)
(52) U.S. Cl.
  CPC ........ *H01P 1/20345* (2013.01); *H01P 1/2039* (2013.01); *H01P 1/20309* (2013.01); *H01P 1/20381* (2013.01); *H03H 7/0115* (2013.01); *H03H 7/0161* (2013.01)
(58) Field of Classification Search
  CPC ......... H03H 7/0115; H03H 2001/0085; H03H 7/09; H01P 1/20345; H01P 1/20309

USPC .......................................... 333/175, 185, 177
See application file for complete search history.

(56) References Cited

U.S. PATENT DOCUMENTS

2007/0085108 A1* 4/2007 White .................. H01L 23/552
                                                                 257/173
2017/0093358 A1* 3/2017 Imamura ............. H01F 17/0013

FOREIGN PATENT DOCUMENTS

JP            2006-311100 A      11/2006

* cited by examiner

*Primary Examiner* — Rakesh B Patel
(74) *Attorney, Agent, or Firm* — Oliff PLC

(57) ABSTRACT

A band-pass filter includes a main body, five resonators, a shield, and a partition. The main body is formed of a dielectric. The partition is formed of a conductor. The five resonators are configured so that capacitive coupling is established between every two of the resonators adjacent to each other in circuit configuration. Each of the five resonators includes a resonator conductor portion. A first stage resonator and a fifth stage resonator are magnetically coupled to each other although not adjacent to each other in circuit configuration. The partition extends to pass between the respective resonator conductor portions of the first stage resonator and the fifth stage resonator, and is electrically connected to the shield.

20 Claims, 18 Drawing Sheets

BAND-PASS FILTER

BACKGROUND OF THE INVENTION

1. Field of the Invention

The present invention relates to a band-pass filter including a plurality of resonators and a shield.

2. Description of the Related Art

The standardization of fifth-generation mobile communication systems (hereinafter referred to as 5G) is currently ongoing. For 5G, the use of frequency bands of 10 GHz or higher, particularly a quasi-millimeter wave band of 10 to 30 GHz and a millimeter wave band of 30 to 300 GHz, is being studied to expand the frequency band.

One of electronic components used in a communication apparatus is a band-pass filter including a plurality of resonators. Each of the plurality of resonators includes, for example, a conductor portion that is long in one direction. To avoid electromagnetic radiation to the surroundings, some band-pass filters are configured so that the plurality of resonators are surrounded by a shield.

JP2006-311100A describes a chip-type multistage filter device usable in quasi-millimeter and millimeter wave bands. The chip-type multistage filter device includes a multilayer substrate, first and second surface ground electrodes, first and second internal ground electrodes, and first and second $\lambda/2$ resonator electrodes. The multilayer substrate is formed by stacking a plurality of dielectric layers. The multilayer substrate has first and second main surfaces opposed to each other, and first to fourth side surfaces connecting the first and second main surfaces. The first side surface and the second side surface are opposed to each other. The first surface ground electrode is disposed on the first side surface. The second surface ground electrode is disposed on the second side surface. The first internal ground electrode is disposed on one of the dielectric layers of the multilayer substrate that is relatively close to the first main surface. The second internal ground electrode is disposed on another one of the dielectric layers of the multilayer substrate that is relatively close to the second main surface. The first and second $\lambda/2$ resonator electrodes are disposed in an area surrounded by the first and second surface ground electrodes and the first and second internal ground electrodes.

The chip-type multistage filter device described in JP2006-311100A further includes a via hole conductor and a capacitance unit. The via hole conductor is formed to run through at least some of the dielectric layers so that the first and second internal ground electrodes are electrically connected to each other. The first and second $\lambda/2$ resonator electrodes are opposed to each other with the via hole conductor interposed therebetween. The capacitance unit is disposed within the multilayer substrate to add a coupling capacitance to between the first and second $\lambda/2$ resonator electrodes.

In a band-pass filter that is configured so that a plurality of resonators are surrounded by a shield, the shield and a dielectric material inside the shield constitute a structure similar to a waveguide, thereby generating at least one propagation mode for electromagnetic waves. Such a propagation mode for electromagnetic waves will hereinafter be referred to as a waveguide mode. In the band-pass filter, disadvantageously, the waveguide mode produces unwanted resonance having a resonance frequency in a frequency region above the passband, thus degrading the attenuation characteristic in the frequency region above the passband. For a band-pass filter that is designed to have a passband in the quasi-millimeter or millimeter wave band, the above-described problem is particularly noticeable because even the resonance frequency of a waveguide mode that is the lowest in resonance frequency (hereinafter, referred to as a lowest-order waveguide mode) is relatively close to the passband.

The resonance frequency of the lowest-order waveguide mode varies depending on the shape of the space defined by the shield. Typically, the larger the space, the lower the resonance frequency of the lowest-order waveguide mode.

JP 2006-311100A describes that resonance caused by outside shape can be reduced by the via hole conductor. The resonance caused by the outside shape corresponds to resonance caused by the above-described waveguide mode.

However, the filter device described in JP 2006-311100A has the following problem. In the filter device, the via hole conductor is disposed between the two $\lambda/2$ resonator electrodes that are adjacent to each other in circuit configuration and are capacitively coupled to each other. Typically, in a band-pass filter in which two resonators adjacent to each other in circuit configuration are configured to be coupled to each other, strong coupling is required between such two resonators. The filter device described in JP 2006-311100A has the problem that the production of strong capacitive coupling between two $\lambda/2$ resonator electrodes that are adjacent to each other in circuit configuration and the placement of the via hole conductor between such two $\lambda/2$ resonator electrodes are difficult to achieve at the same time without a deterioration in the characteristics of the band-pass filter.

SUMMARY OF THE INVENTION

It is an object of the present invention to provide a band-pass filter including a plurality of resonators and a shield and having favorable characteristics.

A band-pass filter of the present invention includes: a main body formed of a dielectric; a first input/output port and a second input/output port integrated with the main body; three or more resonators; a shield; and a partition. The three or more resonators are provided within the main body, located between the first input/output port and the second input/output port in circuit configuration, and configured so that electromagnetic coupling is established between every two of the resonators adjacent to each other in circuit configuration. The shield is formed of a conductor and integrated with the main body. The partition is formed of a conductor, provided within the main body, and electrically connected to the shield.

The shield includes a first portion and a second portion spaced from each other in a first direction, and a connecting portion connecting the first and second portions. The first portion, the second portion and the connecting portion are arranged to surround the three or more resonators.

The three or more resonators include a first resonator and a second resonator that are configured to be magnetically coupled to each other although not adjacent to each other in circuit configuration. The first resonator includes a first resonator conductor portion formed of a conductor. The second resonator includes a second resonator conductor portion formed of a conductor. Each of the first and second resonator conductor portions extends in a direction intersecting the first direction.

The partition is in contact with the first portion and the second portion. At least part of the partition extends to pass between the first resonator conductor portion and the second resonator conductor portion.

In the band-pass filter of the present invention, the electromagnetic coupling between every two of the resonators adjacent to each other in circuit configuration may be capacitive coupling.

In the band-pass filter of the present invention, each of the three or more resonators may be a resonator with open ends.

In the band-pass filter of the present invention, the partition may extend in the first direction and connect the first portion and the second portion via a shortest path.

In the band-pass filter of the present invention, the first resonator may be a resonator that is the closest to the first input/output port in circuit configuration, and the second resonator may be a resonator that is the closest to the second input/output port in circuit configuration. In this case, the three or more resonators may be five resonators.

In the band-pass filter of the present invention, the first resonator may be a resonator that is the second closest to the first input/output port in circuit configuration, and the second resonator may be a resonator that is the second closest to the second input/output port in circuit configuration. In this case, the three or more resonators may be six resonators.

The band-pass filter of the present invention may further include a notch filter section for attenuating a signal of a predetermined frequency higher than the passband.

In the band-pass filter of the present invention, the main body may include a multilayer stack composed of a plurality of dielectric layers stacked together in the first direction. In such a case, the multilayer stack may include a main portion composed of two or more dielectric layers stacked together, among the plurality of dielectric layers. The main portion has a first end face and a second end face located at opposite ends in the first direction. The first portion may be formed of a first conductor layer disposed on the first end face. The second portion may be formed of a second conductor layer disposed on the second end face. The partition may run through the two or more dielectric layers. The partition may include a plurality of first through hole lines each running through the two or more dielectric layers. Each of the plurality of first through hole lines may include two or more through holes connected in series. The connecting portion of the shield may include a plurality of second through hole lines each running through the two or more dielectric layers. Each of the plurality of second through hole lines may include two or more through holes connected in series.

In the band-pass filter of the present invention, when the main body includes the aforementioned multilayer stack, the first resonator conductor portion and the second resonator conductor portion may be located at the same position in the multilayer stack in the first direction.

In the band-pass filter of the present invention, the partition divides the space defined by the shield into a space in which the first resonator conductor portion is located and a space in which the second resonator conductor portion is located. The present invention thereby makes the resonance frequency of the lowest-order waveguide mode higher than in the case without the partition. Further, according to the present invention, magnetic coupling is established between the first resonator and the second resonator that are not adjacent to each other in circuit configuration. This enables creation of an attenuation pole in at least one of two frequency regions in a frequency response of insertion loss. One of the two frequency regions is a first passband-vicinity region, which is a frequency region close to the passband and lower than the passband, and the other is a second passband-vicinity region, which is a frequency region close to the passband and higher than the passband. The present invention thus enables realization of a band-pass filter including a plurality of resonators and a shield and having favorable characteristics.

Other and further objects, features and advantages of the invention will appear more fully from the following description.

DETAILED DESCRIPTION OF THE PREFERRED EMBODIMENTS

First Embodiment

Figure 1:
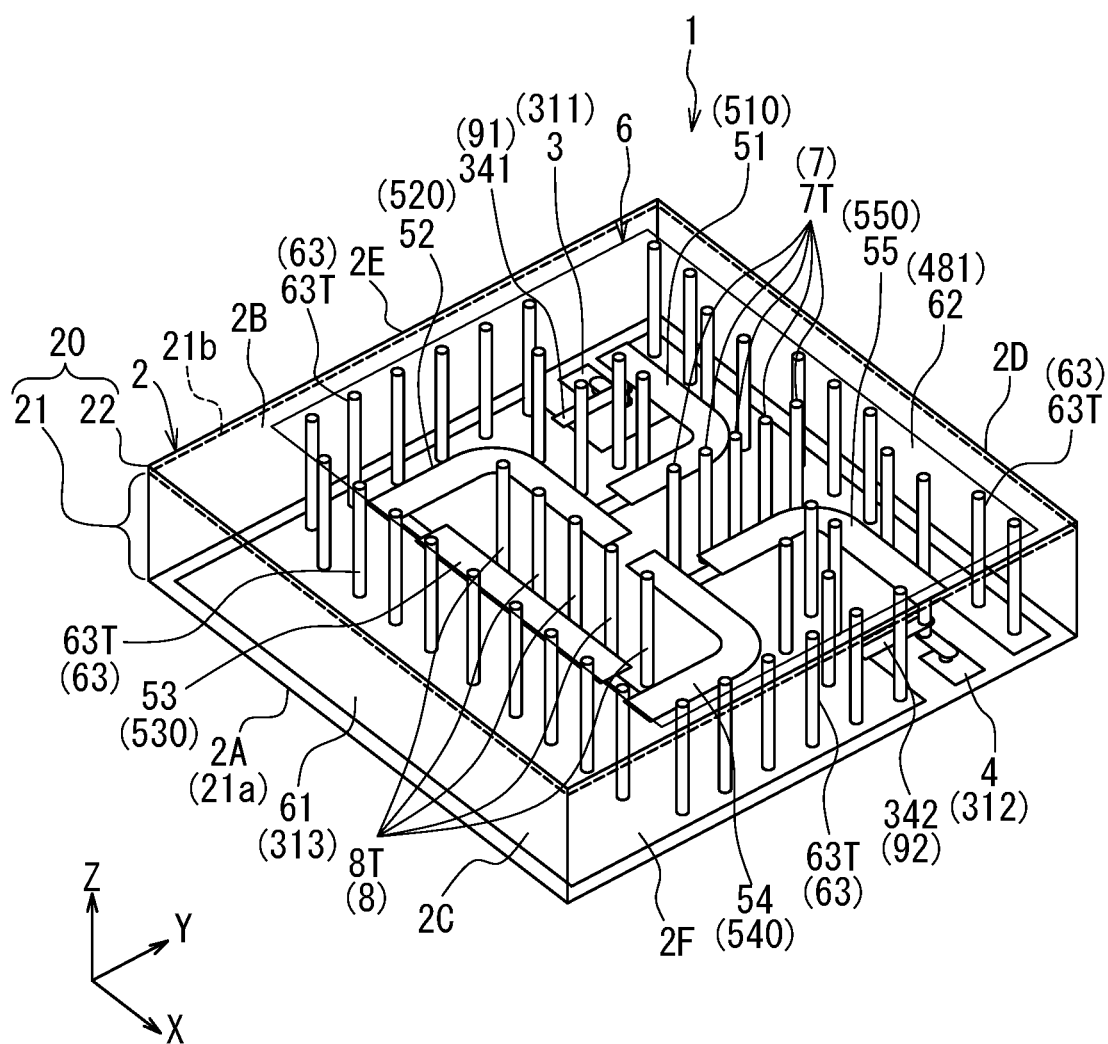
FIG. 1 is a perspective view illustrating the structure of a band-pass filter according to a first embodiment of the invention.
Figure 2:
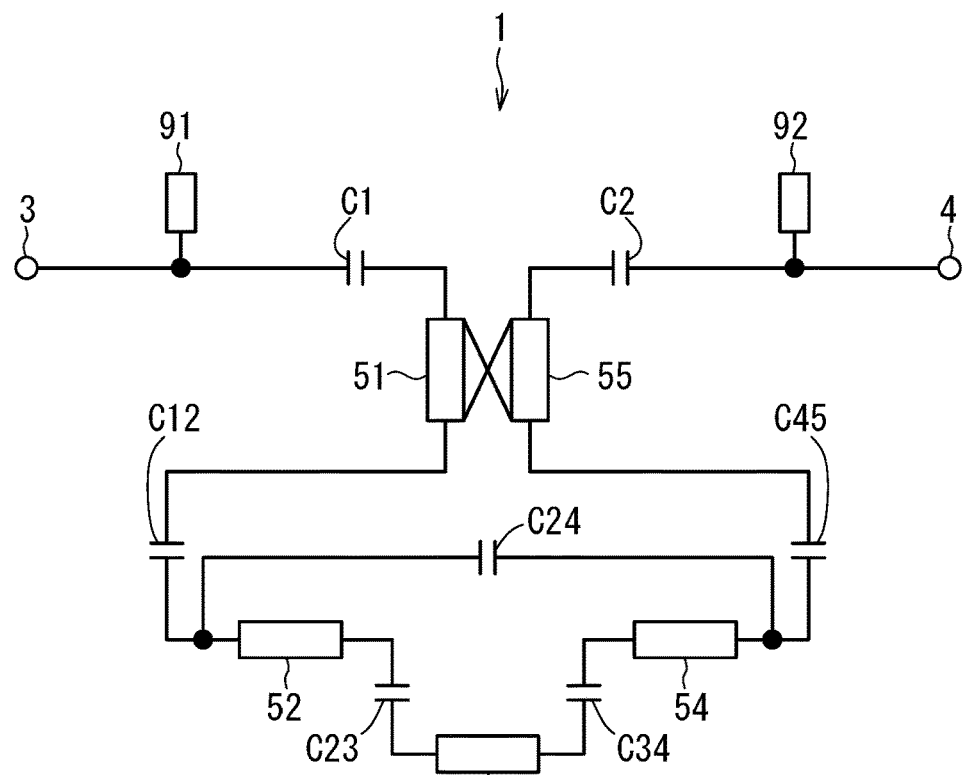
FIG. 2 is a circuit diagram illustrating the circuit configuration of the band-pass filter according to the first embodiment of the invention.

Preferred embodiments of the present invention will now be described in detail with reference to the drawings. First, reference is made to FIG. 1 and FIG. 2 to describe the configuration of a band-pass filter according to a first embodiment of the invention. FIG. 1 is a perspective view illustrating the structure of the band-pass filter according to the present embodiment. FIG. 2 is a circuit diagram illustrating the circuit configuration of the band-pass filter according to the present embodiment.

As shown in FIG. 1, the band-pass filter 1 according to the present embodiment includes: a main body 2 formed of a dielectric; a first input/output port 3 and a second input/output port 4 integrated with the main body 2; three or more resonators provided within the main body 2; a shield 6; a first partition 7; and a second partition 8. The shield 6 is formed of a conductor and integrated with the main body 2. The shield 6 is connected to the ground. The shield 6 has the function of preventing electromagnetic radiation to the surroundings of the band-pass filter 1. Each of the first partition 7 and the second partition 8 is formed of a conductor, provided within the main body 2 and electrically connected to the shield 6. The first partition 7 corresponds to the partition in the present invention.

The main body 2 includes a multilayer stack 20 composed of a plurality of dielectric layers stacked together. Here, X, Y and Z directions are defined as shown in FIG. 1. The X, Y and Z directions are orthogonal to one another. In the present embodiment, the direction in which the plurality of dielectric layers are stacked is the Z direction (the upward direction in FIG. 1). The Z direction corresponds to the first direction in the present invention.

The main body 2 is shaped like a rectangular solid. The main body 2 has a first end face 2A and a second end face 2B located at opposite ends in the Z direction of the main body 2, and further has four side surfaces 2C, 2D, 2E and 2F connecting the first end face 2A and the second end face 2B. The first end face 2A is also the bottom surface of the main body 2. The second end face 2B is also the top surface of the main body 2. The side surfaces 2C and 2D are located at opposite ends in the Y direction of the main body 2. The side surfaces 2E and 2F are located at opposite ends in the X direction of the main body 2.

The three or more resonators are located between the first input/output port 3 and the second input/output port 4 in circuit configuration. The three or more resonators are configured so that electromagnetic coupling is established between every two of the resonators adjacent to each other in circuit configuration. As used herein, the phrase "in circuit configuration" is to describe layout in a circuit diagram, not in a physical configuration. Among the three or more resonators, a resonator that is the n-th closest to the first input/output port 3 in circuit configuration may also be referred to as the n-th stage resonator.

In the present embodiment, as shown in FIG. 2, the three or more resonators are specifically five resonators 51, 52, 53, 54 and 55. The five resonators 51, 52, 53, 54 and 55 are arranged in this order, from closest to farthest, from the first input/output port 3 in circuit configuration. The resonators 51 to 55 are configured so that the resonators 51 and 52 are adjacent to each other in circuit configuration and are electromagnetically coupled to each other, the resonators 52 and 53 are adjacent to each other in circuit configuration and are electromagnetically coupled to each other, the resonators 53 and 54 are adjacent to each other in circuit configuration and are electromagnetically coupled to each other, and the resonators 54 and 55 are adjacent to each other in circuit configuration and are electromagnetically coupled to each other. In the present embodiment, the electromagnetic coupling between every two of the resonators adjacent to each other in circuit configuration is specifically capacitive coupling. In the present embodiment, each of the resonators 51 to 55 is a resonator with open ends, and also a half-wave resonator.

The band-pass filter 1 includes a capacitor C12 for establishing capacitive coupling between the resonators 51 and 52, a capacitor C23 for establishing capacitive coupling between the resonators 52 and 53, a capacitor C34 for establishing capacitive coupling between the resonators 53 and 54, and a capacitor C45 for establishing capacitive coupling between the resonators 54 and 55.

In a band-pass filter including three or more resonators configured so that every two of the resonators adjacent to each other in circuit configuration are coupled to each other, electromagnetic coupling may be established between two resonators that are not adjacent to each other in circuit configuration. Such electromagnetic coupling between non-adjacent resonators will be referred to as cross coupling. As will be described in detail below, the band-pass filter 1 according to the present embodiment has two cross couplings.

In the present embodiment, among the five resonators 51 to 55, the resonator 51, which is the closest to the first input/output port 3 in circuit configuration, and the resonator 55, which is the closest to the second input/output port 4 in circuit configuration, are magnetically coupled to each other although they are not adjacent to each other in circuit configuration. The resonator 51 corresponds to the first resonator in the present invention. The resonator 55 corresponds to the second resonator in the present invention.

Further, in the present embodiment, among the five resonators 51 to 55, the resonator 52, which is the second closest to the first input/output port 3 in circuit configuration, and the resonator 54, which is the second closest to the second input/output port 4 in circuit configuration, are capacitively coupled to each other although they are not adjacent to each other in circuit configuration. In FIG. 2, the capacitor symbol C24 represents the capacitive coupling between the resonators 52 and 54.

The band-pass filter 1 further includes a capacitor C1 provided between the first input/output port 3 and the resonator 51, and a capacitor C2 provided between the second input/output port 4 and the resonator 55.

The band-pass filter 1 further includes a notch filter section for attenuating a signal of a predetermined frequency (hereinafter referred to as notch frequency) higher than the passband. The notch filter section includes two lines 91 and 92 each formed of a conductor. Each of the lines 91 and 92 has a first end and a second end opposite to each other. The first end of the line 91 is connected to the first input/output port 3, and the second end of the line 91 is open. The first end of the line 92 is connected to the second input/output port 4, and the second end of the line 92 is open. Each of the lines 91 and 92 has a length of one quarter or nearly one quarter the wavelength corresponding to the notch frequency. Each of the lines 91 and 92 is a quarter-wave resonator that resonates at the notch frequency. The notch frequency is, for example, twice the center frequency of the passband of the band-pass filter 1.

The shield 6 includes a first portion 61 and a second portion 62 spaced from each other in the first direction, i.e., the Z direction, and a connecting portion 63 connecting the first portion 61 and the second portion 62. The first portion 61, the second portion 62 and the connecting portion 63 are arranged to surround the five resonators 51 to 55.

The multilayer stack 20 includes a main portion 21 and a coating portion 22. The main portion 21 is composed of two or more dielectric layers stacked together, among the plurality of dielectric layers constituting the multilayer stack 20. The coating portion 22 is composed of one or more dielectric layers other than the two or more dielectric layers constituting the main portion 21, among the plurality of dielectric layers constituting the multilayer stack 20. The main portion 21 has a first end face 21*a* and a second end face 21*b* located at opposite ends in the direction in which the two or more dielectric layers are stacked. The coating portion 22 covers the second end face 21*b*. The first end face 21*a* of the main portion 21 coincides with the first end face 2A of the main body 2. The second end face 21*b* of the main portion 21 is located within the main body 2.

The first portion 61 is formed of a first conductor layer 313 disposed on the first end face 21*a*. The second portion 62 is formed of a second conductor layer 481 disposed on the second end face 21*b*. The second portion 62 is interposed between the main portion 21 and the coating portion 22.

The resonator 51 includes a resonator conductor portion 510 formed of a conductor. The resonator 52 includes a resonator conductor portion 520 formed of a conductor. The resonator 53 includes a resonator conductor portion 530 formed of a conductor. The resonator 54 includes a resonator conductor portion 540 formed of a conductor. The resonator 55 includes a resonator conductor portion 550 formed of a conductor. The resonator conductor portion 510 corresponds to the first resonator conductor portion in the present invention. The resonator conductor portion 550 corresponds to the second resonator conductor portion in the present invention.

Each of the resonator conductor portions 510, 520, 530, 540 and 550 extends in a direction intersecting the first direction or the Z direction. In the present embodiment, specifically, each of the resonator conductor portions 510, 520, 530, 540 and 550 extends in a direction orthogonal to the first direction or the Z direction.

Each of the resonator conductor portions 510, 520, 530, 540 and 550 has a first end and a second end opposite to each other. As mentioned above, each of the resonators 51 to 55 is a resonator with open ends. Thus, both of the first and second ends of each of the resonator conductor portions 510, 520, 530, 540 and 550 are open. Each of the resonator conductor portions 510, 520, 530, 540 and 550 has a length of one half or nearly one half the wavelength corresponding to the center frequency of the passband of the band-pass filter 1.

The partition 7 is in contact with the first portion 61 and the second portion 62. At least part of the partition 7 extends to pass between the resonator conductor portion 510 and the resonator conductor portion 550. In the present embodiment, specifically, the first partition 7 extends in the first direction, i.e., the Z direction. The first partition 7 connects the first portion 61 and the second portion 62 via the shortest path. To be more specific, the length of the first partition 7 in the Z direction is equal to the distance between the first portion 61 and the second portion 62.

The first partition 7 runs through the two or more dielectric layers constituting the main portion 21. In the present embodiment, the first partition 7 includes a plurality of through hole lines 7T each running through the two or more dielectric layers constituting the main portion 21. The plurality of through hole lines 7T correspond to the plurality of first through hole lines in the present invention. In FIG. 1, each through hole line 7T is represented by a circular column. Each of the through hole lines 7T includes two or more through holes connected in series. Each of the through hole lines 7T extends in the Z direction. The through hole lines 7T are arranged to be adjacent to each other in the Y direction. In the present embodiment, the number of the through hole lines 7T is five.

The second partition 8 extends to pass through the area surrounded by the resonator conductor portions 520, 530 and 540, and is in contact with the first portion 61 and the second portion 62. In the present embodiment, specifically, the second partition 8 extends in the first direction, i.e., the Z direction. The second partition 8 connects the first portion 61 and the second portion 62 via the shortest path. To be more specific, the length of the second partition 8 in the Z direction is equal to the distance between the first portion 61 and the second portion 62.

The second partition 8 runs through the two or more dielectric layers constituting the main portion 21. In the present embodiment, the second partition 8 includes a plurality of through hole lines 8T each running through the two or more dielectric layers constituting the main portion 21. In FIG. 1, each through hole line 8T is represented by a circular column. Each of the through hole lines 8T includes two or more through holes connected in series. Each of the through hole lines 8T extends in the Z direction. The through hole lines 8T are arranged to be adjacent to each other in the X direction. In the present embodiment, the number of the through hole lines 8T is five.

The connecting portion 63 of the shield 6 includes a plurality of through hole lines 63T each running through the two or more dielectric layers constituting the main portion 21. The plurality of through hole lines 63T correspond to the second through hole lines in the present invention. In FIG. 1, each through hole line 63T is represented by a circular column. All the through hole lines represented by circular columns in FIG. 1, except the five through hole lines 7T and the five through hole lines 8T, are the through hole lines 63T. Each of the through hole lines 63T includes two or more through holes connected in series. Each of the through hole lines 63T extends in the Z direction.

Reference is now made to FIG. 3 to FIG. 11 to describe an example of the dielectric layers constituting the multilayer stack 20 and the configuration of a plurality of conductor layers formed on the dielectric layers and a plurality of through holes formed in the dielectric layers. In this example, the multilayer stack 20 includes eighteen dielectric layers stacked together. The eighteen dielectric layers will be referred to as the first to eighteenth dielectric layers in the order from bottom to top. The first to eighteenth dielectric layers are denoted by reference numerals 31 to 48, respectively. The main portion 21 is composed of the first to seventeenth dielectric layers 31 to 47. The coating portion 22 is composed of the eighteenth dielectric layer 48. In FIG. 3 to FIG. 10, each circle represents a through hole.

Figure 3:
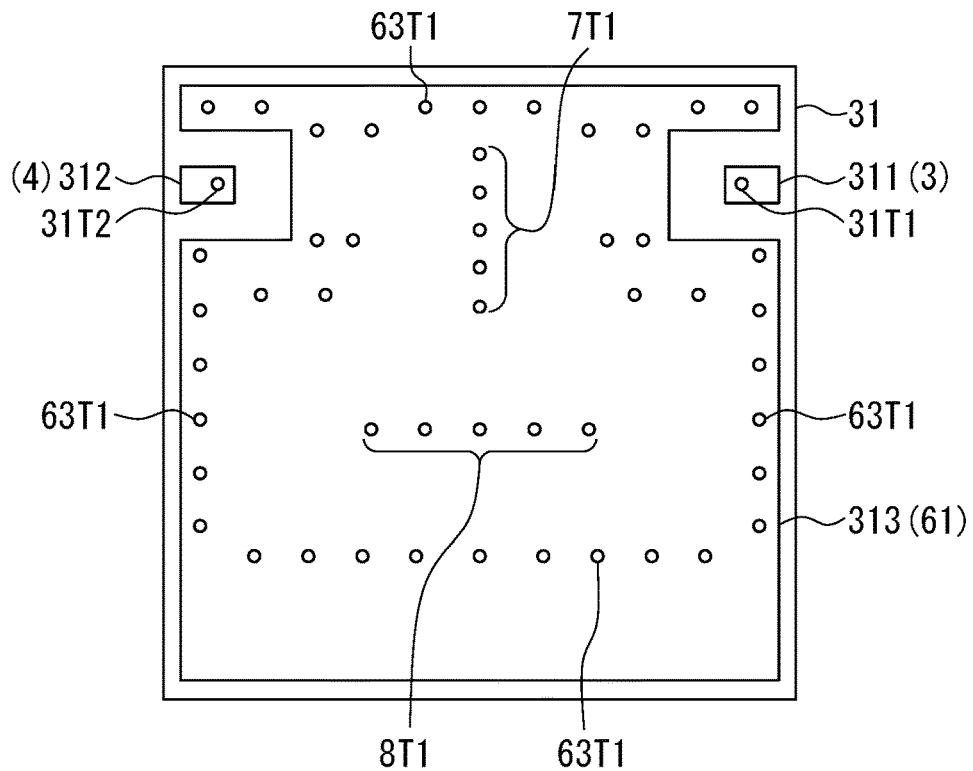
FIG. 3 is an explanatory diagram illustrating a patterned surface of a first dielectric layer of a multilayer stack shown in FIG. 1.

FIG. 3 illustrates a patterned surface of the first dielectric layer 31. On the patterned surface of the first dielectric layer 31, there are formed a conductor layer 311 forming the first input/output port 3, a conductor layer 312 forming the second input/output port 4, and the first conductor layer 313 forming the first portion 61 of the shield 6.

Further, a through hole 31T1 connected to the conductor layer 311, and a through hole 31T2 connected to the conductor layer 312 are formed in the dielectric layer 31.

Further formed in the dielectric layer 31 are five through holes 7T1 constituting respective portions of the five through hole lines 7T, five through holes 8T1 constituting respective portions of the five through hole lines 8T, and a plurality of through holes 63T1 constituting respective portions of the plurality of through hole lines 63T. All the through holes represented by circles in FIG. 3, except the through holes 31T1, 31T2, 7T1 and 8T1, are the through holes 63T1. The through holes 7T1, 8T1 and 63T1 are connected to the first conductor layer 313.

Figure 4:
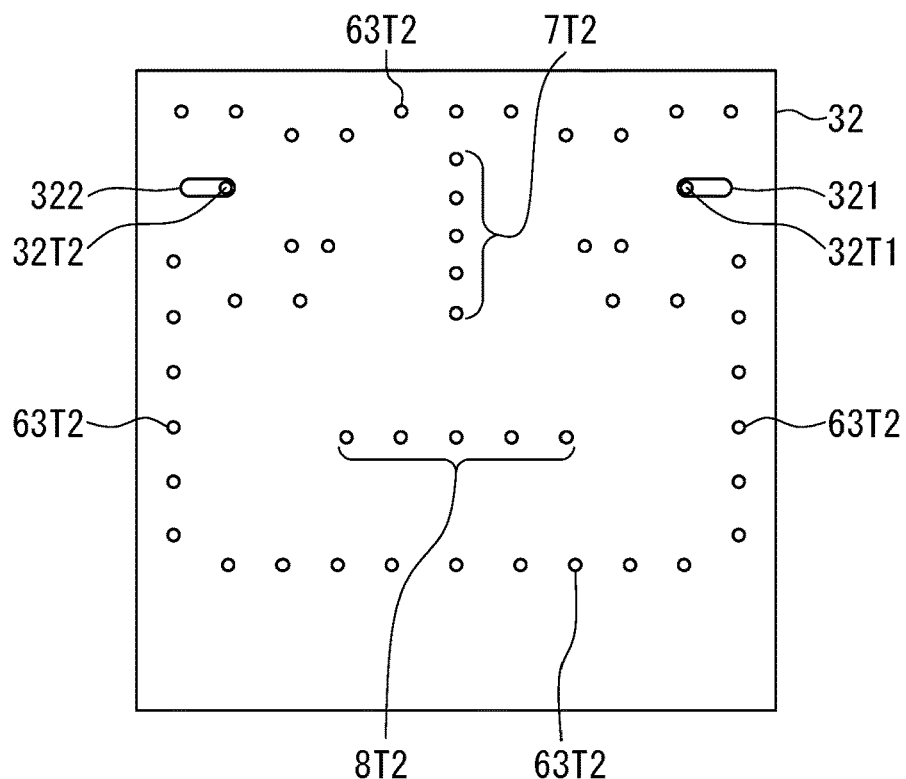
FIG. 4 is an explanatory diagram illustrating a patterned surface of a second dielectric layer of the multilayer stack shown in FIG. 1.

FIG. 4 illustrates a patterned surface of the second dielectric layer 32. Conductor layers 321 and 322 are formed on the patterned surface of the dielectric layer 32. The through holes 31T1 and 31T2 shown in FIG. 3 are connected to the conductor layers 321 and 322, respectively.

In the dielectric layer 32, there are formed a through hole 32T1 connected to the conductor layer 321, and a through hole 32T2 connected to the conductor layer 322.

Further formed in the dielectric layer 32 are five through holes 7T2 constituting respective portions of the five through hole lines 7T. The five through holes 7T1 shown in FIG. 3 are connected to the five through holes 7T2, respectively.

Further formed in the dielectric layer 32 are five through holes 8T2 constituting respective portions of the five through hole lines 8T. The five through holes 8T1 shown in FIG. 3 are connected to the five through holes 8T2, respectively.

Further formed in the dielectric layer 32 are a plurality of through holes 63T2 constituting respective portions of the plurality of through hole lines 63T. All the through holes represented by circles in FIG. 4, except the through holes 32T1, 32T2, 7T2 and 8T2, are the through holes 63T2. The plurality of through holes 63T1 shown in FIG. 3 are connected to the plurality of through holes 63T2, respectively.

Figure 5:
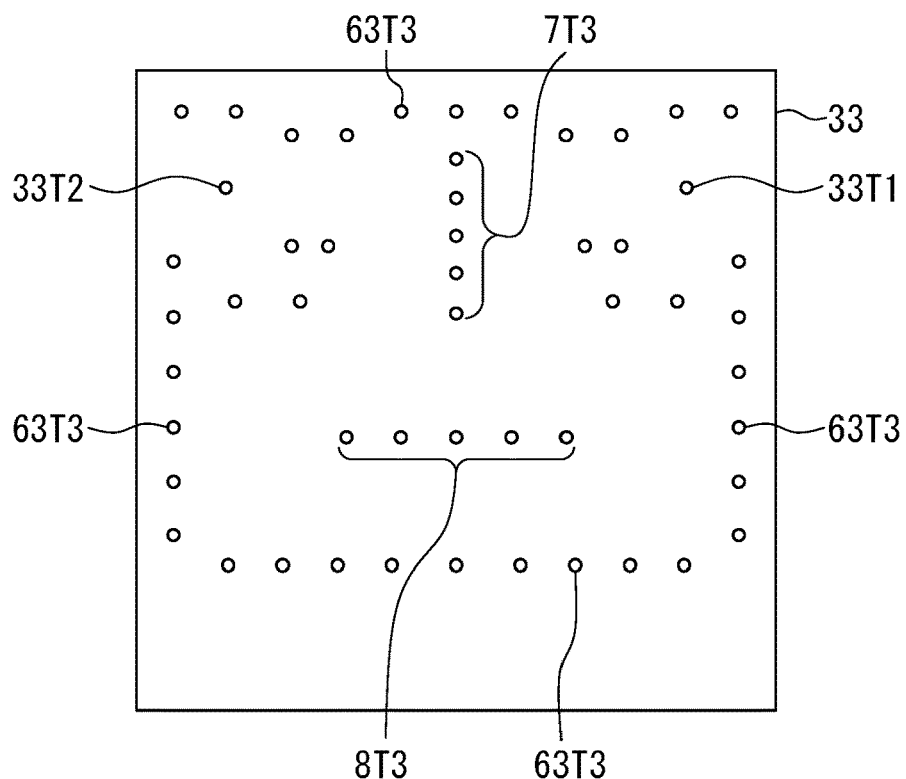
FIG. 5 is an explanatory diagram illustrating a patterned surface of a third dielectric layer of the multilayer stack shown in FIG. 1.

FIG. 5 illustrates a patterned surface of the third dielectric layer 33. Through holes 33T1 and 33T2 are formed in the dielectric layer 33. The through holes 32T1 and 32T2 shown in FIG. 4 are connected to the through holes 33T1 and 33T2, respectively.

Further formed in the dielectric layer 33 are five through holes 7T3 constituting respective portions of the five through hole lines 7T. The five through holes 7T2 shown in FIG. 4 are connected to the five through holes 7T3, respectively.

Further formed in the dielectric layer 33 are five through holes 8T3 constituting respective portions of the five through hole lines 8T. The five through holes 8T2 shown in FIG. 4 are connected to the five through holes 8T3, respectively.

Further formed in the dielectric layer 33 are a plurality of through holes 63T3 constituting respective portions of the plurality of through hole lines 63T. All the through holes represented by circles in FIG. 5, except the through holes 33T1, 33T2, 7T3 and 8T3, are the through holes 63T3. The plurality of through holes 63T2 shown in FIG. 4 are connected to the plurality of through holes 63T3, respectively.

Figure 6:
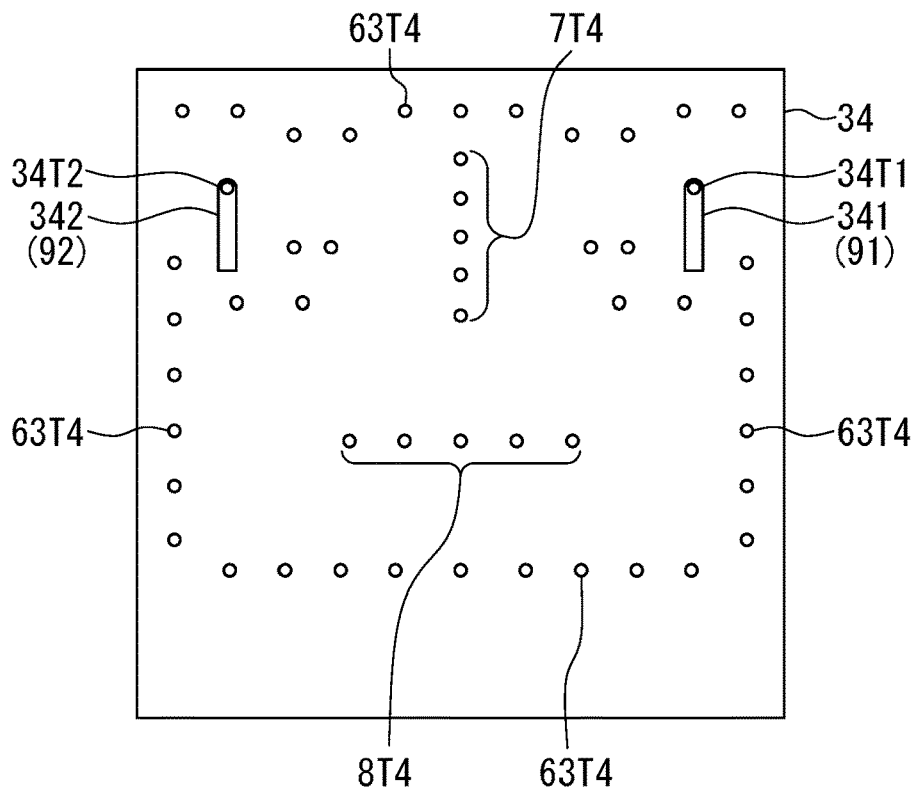
FIG. 6 is an explanatory diagram illustrating a patterned surface of a fourth dielectric layer of the multilayer stack shown in FIG. 1.

FIG. 6 illustrates a patterned surface of the fourth dielectric layer 34. On the patterned surface of the dielectric layer 34, there are formed a conductor layer 341 forming the line 91, and a conductor layer 342 forming the line 92. Each of the conductor layers 341 and 342 has a first end and a second end opposite to each other. The through hole 33T1 shown in FIG. 5 is connected to a portion of the conductor layer 341 near the first end thereof. The through hole 33T2 shown in FIG. 5 is connected to a portion of the conductor layer 342 near the first end thereof. A portion of the conductor layer 341 near the second end thereof and a portion of the conductor layer 342 near the second end thereof are opposed to the conductor layer 313 shown in FIG. 3 with the dielectric layers 31, 32 and 33 interposed between the conductor layer 313 and each of the aforementioned portions of the conductor layers 341 and 342.

Further formed in the dielectric layer 34 are a through hole 34T1 connected to the portion of the conductor layer 341 near the first end thereof, and a through hole 34T2 connected to the portion of the conductor layer 342 near the first end thereof.

Further formed in the dielectric layer 34 are five through holes 7T4 constituting respective portions of the five through hole lines 7T. The five through holes 7T3 shown in FIG. 5 are connected to the five through holes 7T4, respectively.

Further formed in the dielectric layer 34 are five through holes 8T4 constituting respective portions of the five through hole lines 8T. The five through holes 8T3 shown in FIG. 5 are connected to the five through holes 8T4, respectively.

Further formed in the dielectric layer 34 are a plurality of through holes 63T4 constituting respective portions of the plurality of through hole lines 63T. All the through holes represented by circles in FIG. 6, except the through holes 34T1, 34T2, 7T4 and 8T4, are the through holes 63T4. The plurality of through holes 63T3 shown in FIG. 5 are connected to the plurality of through holes 63T4, respectively.

Figure 7:
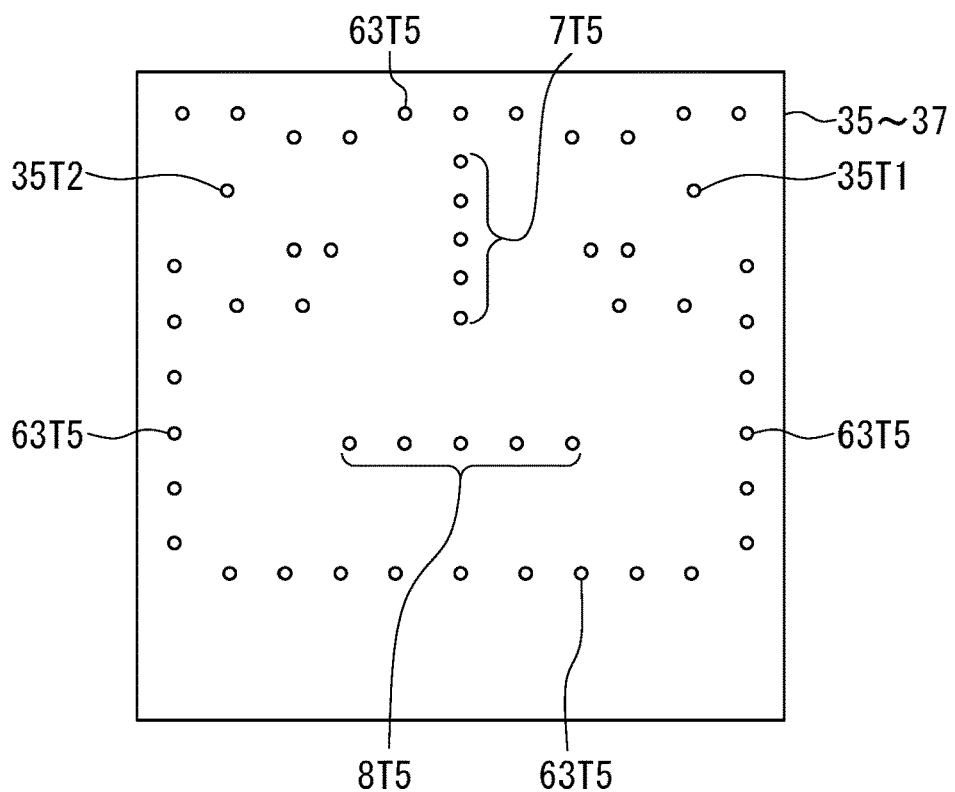
FIG. 7 is an explanatory diagram illustrating a patterned surface of each of a fifth to a seventh dielectric layer of the multilayer stack shown in FIG. 1.

FIG. 7 illustrates a patterned surface of each of the fifth to seventh dielectric layers 35 to 37. Through holes 35T1 and 35T2 are formed in each of the dielectric layers 35 to 37. The through holes 34T1 and 34T2 shown in FIG. 6 are respectively connected to the through holes 35T1 and 35T2 formed in the fifth dielectric layer 35.

In each of the dielectric layers 35 to 37, there are further formed five through holes 7T5 constituting respective portions of the five through hole lines 7T. The five through holes 7T4 shown in FIG. 6 are respectively connected to the five through holes 7T5 formed in the fifth dielectric layer 35.

In each of the dielectric layers 35 to 37, there are further formed five through holes 8T5 constituting respective portions of the five through hole lines 8T. The five through holes 8T4 shown in FIG. 6 are respectively connected to the five through holes 8T5 formed in the fifth dielectric layer 35.

Further, a plurality of through holes 63T5 constituting respective portions of the plurality of through hole lines 63T are formed in each of the dielectric layers 35 to 37. All the through holes represented by circles in FIG. 7, except the through holes 35T1, 35T2, 7T5 and 8T5, are the through holes 63T5. The plurality of through holes 63T4 shown in FIG. 6 are respectively connected to the plurality of through holes 63T5 formed in the fifth dielectric layer 35.

In the dielectric layers 35 to 37, every vertically adjacent through holes denoted by the same reference signs are connected to each other.

Figure 8:
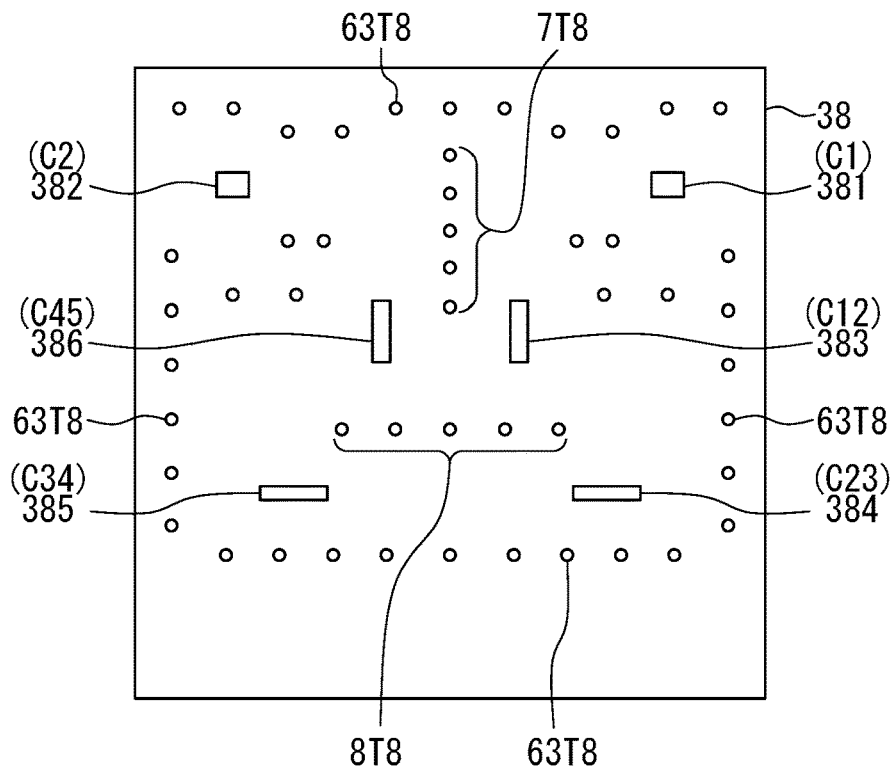
FIG. 8 is an explanatory diagram illustrating a patterned surface of an eighth dielectric layer of the multilayer stack shown in FIG. 1.

FIG. 8 illustrates a patterned surface of the eighth dielectric layer 38. On the patterned surface of the dielectric layer 38, there are formed a conductor layer 381 for forming the capacitor C1 shown in FIG. 2 and a conductor layer 382 for forming the capacitor C2 shown in FIG. 2. The through hole 35T1 formed in the seventh dielectric layer 37 is connected to the conductor layer 381. The through hole 35T2 formed in the seventh dielectric layer 37 is connected to the conductor layer 382.

On the patterned surface of the dielectric layer 38, there are further formed conductor layers 383, 384, 385 and 386 for forming the capacitors C12, C23, C34 and C45 shown in FIG. 2, respectively.

Further, five through holes 7T8 constituting respective portions of the five through hole lines 7T are formed in the dielectric layer 38. The five through holes 7T5 formed in the seventh dielectric layer 37 are connected to the five through holes 7T8, respectively.

Further formed in the dielectric layer 38 are five through holes 8T8 constituting respective portions of the five through hole lines 8T. The five through holes 8T5 formed in the seventh dielectric layer 37 are connected to the five through holes 8T8, respectively.

Further formed in the dielectric layer 38 are a plurality of through holes 63T8 constituting respective portions of the plurality of through hole lines 63T. All the through holes represented by circles in FIG. 8, except the through holes 7T8 and 8T8, are the through holes 63T8. The plurality of through holes 63T5 formed in the seventh dielectric layer 37 are connected to the plurality of through holes 63T8, respectively.

Figure 9:
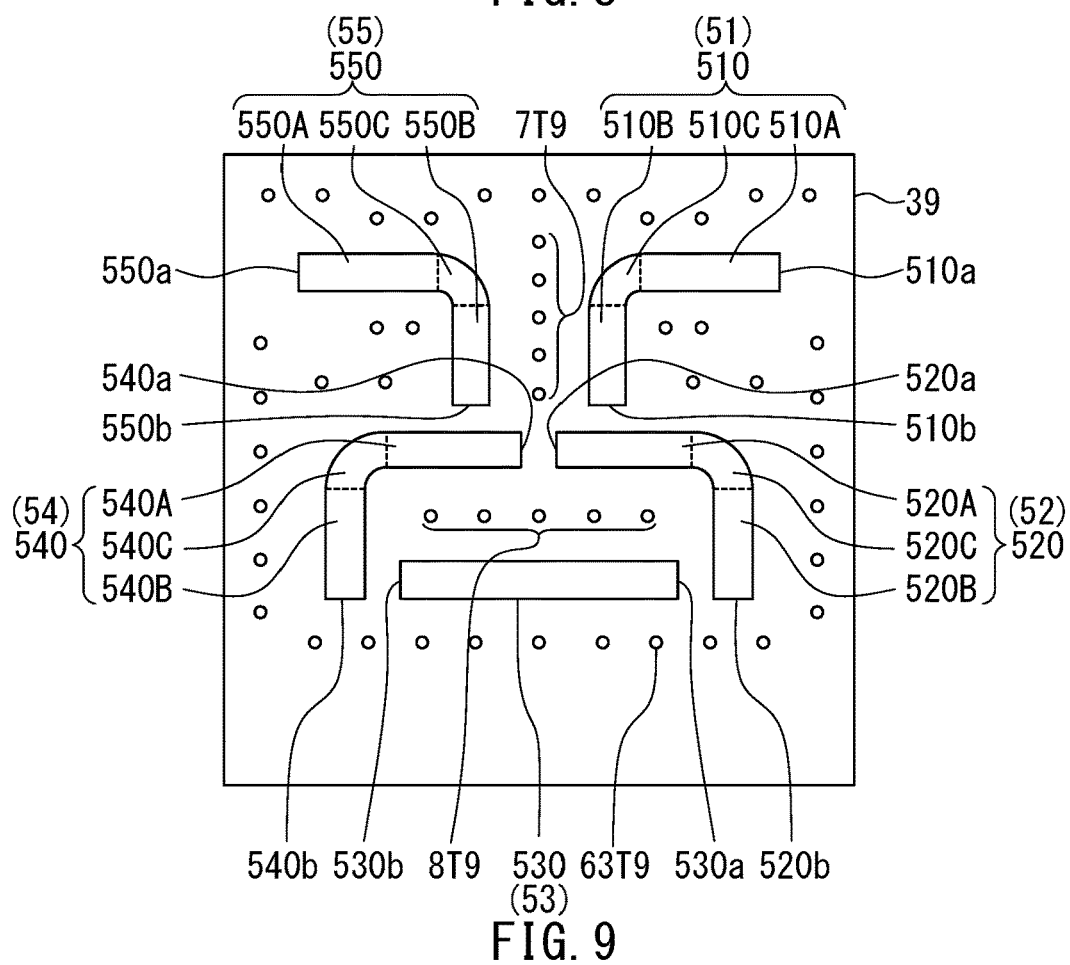
FIG. 9 is an explanatory diagram illustrating a patterned surface of a ninth dielectric layer of the multilayer stack shown in FIG. 1.

FIG. 9 illustrates a patterned surface of the ninth dielectric layer 39. The resonator conductor portions 510, 520, 530, 540 and 550 are formed on the patterned surface of the dielectric layer 39.

The resonator conductor portion 510 has a first end 510a and a second end 510b opposite to each other. The resonator conductor portion 520 has a first end 520a and a second end 520b opposite to each other. The resonator conductor portion 530 has a first end 530a and a second end 530b opposite to each other. The resonator conductor portion 540 has a first end 540a and a second end 540b opposite to each other. The resonator conductor portion 550 has a first end 550a and a second end 550b opposite to each other.

The resonator conductor portion 510 includes a first portion 510A, a second portion 510B and a third portion 510C. The first portion 510A includes the first end 510a, and the second portion 510B includes the second end 510b. The first portion 510A extends in the X direction, and the second portion 510B extends in the Y direction. The third portion 510C connects an end of the first portion 510A opposite from the first end 510a and an end of the second portion 510B opposite from the second end 510b. In FIG. 9, the boundary between the first portion 510A and the third portion 510C and the boundary between the second portion 510B and the third portion 510C are shown by broken lines. The first portion 510A is closer to the first input/output port 3 than the second portion 510B in circuit configuration.

The resonator conductor portion 550 includes a first portion 550A, a second portion 550B and a third portion 550C. The first portion 550A includes the first end 550a, and the second portion 550B includes the second end 550b. The first portion 550A extends in the X direction, and the second portion 550B extends in the Y direction. The third portion 550C connects an end of the first portion 550A opposite from the first end 550a and an end of the second portion 550B opposite from the second end 550b. In FIG. 9, the boundary between the first portion 550A and the third portion 550C and the boundary between the second portion 550B and the third portion 550C are shown by broken lines. The first portion 550A is closer to the second input/output port 4 than the second portion 550B in circuit configuration.

The second portion 510B of the resonator conductor portion 510 and the second portion 550B of the resonator conductor portion 550 are at a predetermined distance from each other and adjacent to each other in the X direction. The distance between the second portion 510B and the second portion 550B is smaller than the length of each of the resonator conductor portions 510 and 550.

The resonator conductor portion 520 includes a first portion 520A, a second portion 520B and a third portion 520C. The first portion 520A includes the first end 520a, and the second portion 520B includes the second end 520b. The first portion 520A extends in the X direction, and the second portion 520B extends in the Y direction. The third portion 520C connects an end of the first portion 520A opposite from the first end 520a and an end of the second portion 520B opposite from the second end 520b. In FIG. 9, the boundary between the first portion 520A and the third portion 520C and the boundary between the second portion 520B and the third portion 520C are shown by broken lines. The first end 520a is located near the second end 510b of the resonator conductor portion 510.

The resonator conductor portion 540 includes a first portion 540A, a second portion 540B and a third portion 540C. The first portion 540A includes the first end 540a, and the second portion 540B includes the second end 540b. The first portion 540A extends in the X direction, and the second portion 540B extends in the Y direction. The third portion 540C connects an end of the first portion 540A opposite from the first end 540a and an end of the second portion 540B opposite from the second end 540b. In FIG. 9, the boundary between the first portion 540A and the third portion 540C and the boundary between the second portion 540B and the third portion 540C are shown by broken lines. The first end 540a is located near the second end 550b of the resonator conductor portion 550.

The first end 520a of the resonator conductor portion 520 and the first end 540a of the resonator conductor portion 540 are at a predetermined distance from each other and adjacent to each other. The distance between the first end 520a and the first end 540a is sufficiently smaller than the length of each of the resonator conductor portions 520 and 540.

The resonator conductor portion 530 extends in the X direction. The first end 530a of the resonator conductor portion 530 is located near the second end 520b of the resonator conductor portion 520. The second end 530b of the resonator conductor portion 530 is located near the second end 540b of the resonator conductor portion 540. Further, five through holes 7T9 constituting respective portions of the five through hole lines 7T are formed in the dielectric layer 39. The five through holes 7T8 shown in FIG. 8 are connected to the five through holes 7T9, respectively.

Further formed in the dielectric layer 39 are five through holes 8T9 constituting respective portions of the five through hole lines 8T. The five through holes 8T8 shown in FIG. 8 are connected to the five through holes 8T9, respectively.

Further formed in the dielectric layer 39 are a plurality of through holes 63T9 constituting respective portions of the plurality of through hole lines 63T. All the through holes represented by circles in FIG. 9, except the through holes 7T9 and 8T9, are the through holes 63T9. The plurality of through holes 63T8 shown in FIG. 8 are connected to the plurality of through holes 63T9, respectively.

Figure 10:
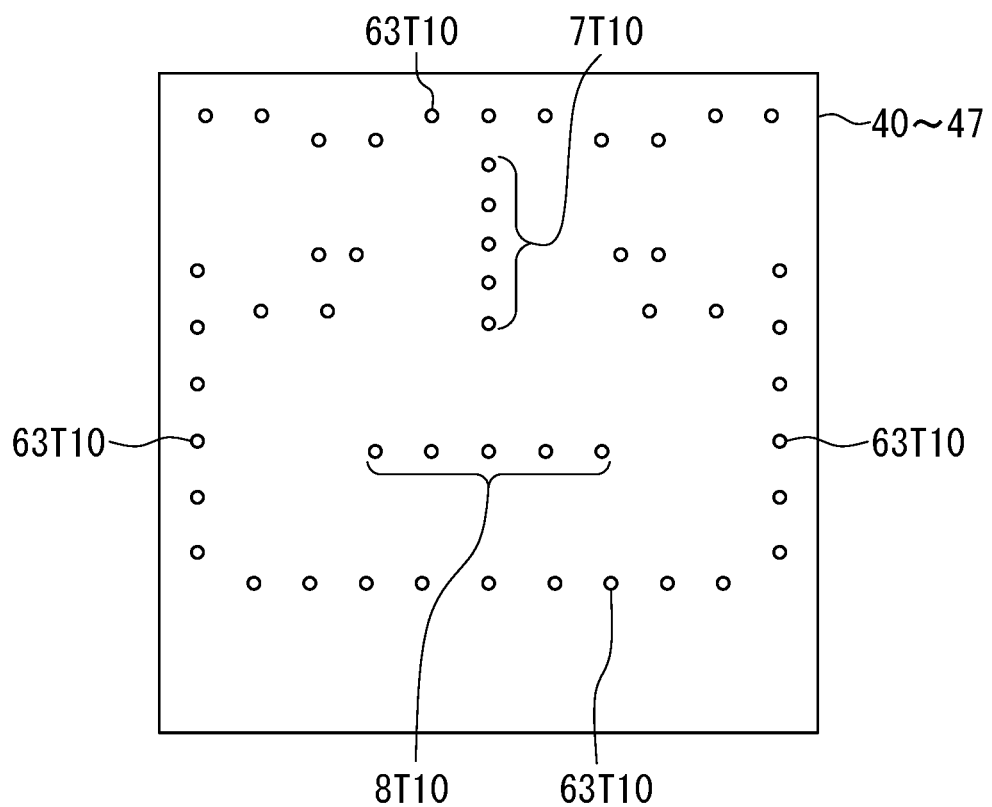
FIG. 10 is an explanatory diagram illustrating a patterned surface of each of a tenth to a seventeenth dielectric layer of the multilayer stack shown in FIG. 1.

FIG. 10 illustrates a patterned surface of each of the tenth to seventeenth dielectric layers 40 to 47. Five through holes 7T10 constituting respective portions of the five through hole lines 7T are formed in each of the dielectric layers 40 to 47. The five through holes 7T9 shown in FIG. 9 are respectively connected to the five through holes 7T10 formed in the tenth dielectric layer 40.

In each of the dielectric layers 40 to 47, there are further formed five through holes 8T10 constituting respective portions of the five through hole lines 8T. The five through holes 8T9 shown in FIG. 9 are respectively connected to the five through holes 8T10 formed in the tenth dielectric layer 40.

Further, a plurality of through holes 63T10 constituting respective portions of the plurality of through hole lines 63T are formed in each of the dielectric layers 40 to 47. All the through holes represented by circles in FIG. 10, except the through holes 7T10 and 8T10, are the through holes 63T10. The plurality of through holes 63T9 shown in FIG. 9 are respectively connected to the plurality of through holes 63T10 formed in the tenth dielectric layer 40.

In the dielectric layers 40 to 47, every vertically adjacent through holes denoted by the same reference signs are connected to each other.

Figure 11:
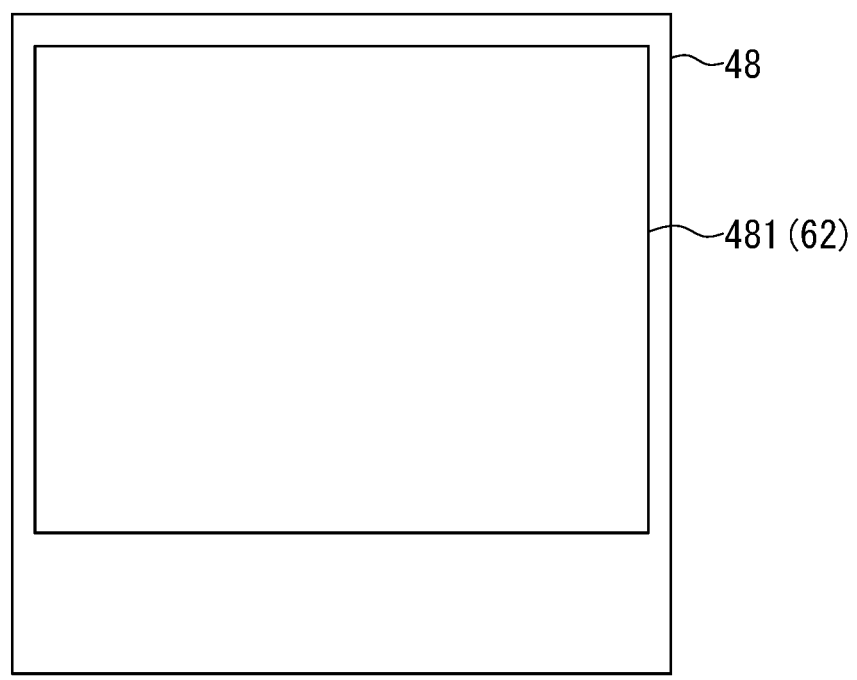
FIG. 11 is an explanatory diagram illustrating a patterned surface of an eighteenth dielectric layer of the multilayer stack shown in FIG. 1.

FIG. 11 illustrates a patterned surface of the eighteenth dielectric layer 48. The second conductor layer 481 forming the second portion 62 of the shield 6 is formed on the patterned surface of the dielectric layer 48. The through holes 7T10, 8T10 and 63T10 formed in the seventeenth dielectric layer 47 are connected to the second conductor layer 481.

The band-pass filter 1 according to the present embodiment is formed by stacking the first to eighteenth dielectric layers 31 to 48 such that the patterned surface of the first dielectric layer 31 also serves as the first end face 2A of the main body 2. A surface of the eighteenth dielectric layer 48 opposite to the patterned surface serves as the second end face 2B of the main body 2. The first to eighteenth dielectric layers 31 to 48 constitute the multilayer stack 20.

The respective resonator conductor portions 510, 520, 530, 540 and 550 of the resonators 51 to 55 are located at the same position in the multilayer stack 20 in the first direction, i.e., the Z direction.

The conductor layer 311 forming the first input/output port 3 is connected to the conductor layer 381 shown in FIG. 8 via the through hole 31T1, the conductor layer 321 and the through holes 32T1, 33T1, 34T1 and 35T1. The conductor layer 381 is opposed to a portion of the resonator conductor portion 510 (FIG. 9) near the first end 510a with the dielectric layer 38 interposed therebetween. The capacitor C1 shown in FIG. 2 is composed of the conductor layer 381 and the resonator conductor portion 510, and also the dielectric layer 38 interposed therebetween.

The conductor layer 312 forming the second input/output port 4 is connected to the conductor layer 382 shown in FIG. 8 via the through hole 31T2, the conductor layer 322 and the through holes 32T2, 33T2, 34T2 and 35T2. The conductor layer 382 is opposed to a portion of the resonator conductor portion 550 (FIG. 9) near the first end 550a with the dielectric layer 38 interposed therebetween. The capacitor C2 shown in FIG. 2 is composed of the conductor layer 382 and the resonator conductor portion 550, and also the dielectric layer 38 interposed therebetween.

The conductor layer 383 shown in FIG. 8 is opposed to a portion of the resonator conductor portion 510 near the second end 510b and to a portion of the resonator conductor portion 520 near the first end 520a, with the dielectric layer 38 interposed between the conductor layer 383 and each of the aforementioned respective portions of the resonator conductor portions 510 and 520. The capacitor C12 shown in FIG. 2 is composed of the conductor layer 383, the resonator conductor portions 510 and 520, and the dielectric layer 38 interposed between the conductor layer 383 and the resonator conductor portions 510 and 520.

The conductor layer 384 shown in FIG. 8 is opposed to a portion of the resonator conductor portion 520 near the second end 520b and to a portion of the resonator conductor portion 530 near the first end 530a, with the dielectric layer 38 interposed between the conductor layer 384 and each of the aforementioned respective portions of the resonator conductor portions 520 and 530. The capacitor C23 shown in FIG. 2 is composed of the conductor layer 384, the resonator conductor portions 520 and 530, and the dielectric layer 38 interposed between the conductor layer 384 and the resonator conductor portions 520 and 530.

The conductor layer 385 shown in FIG. 8 is opposed to a portion of the resonator conductor portion 530 near the second end 530b and to a portion of the resonator conductor portion 540 near the second end 540b, with the dielectric layer 38 interposed between the conductor layer 385 and each of the aforementioned respective portions of the resonator conductor portions 530 and 540. The capacitor C34 shown in FIG. 2 is composed of the conductor layer 385, the resonator conductor portions 530 and 540, and the dielectric layer 38 interposed between the conductor layer 385 and the resonator conductor portions 530 and 540.

The conductor layer 386 shown in FIG. 8 is opposed to a portion of the resonator conductor portion 540 near the first end 540a and to a portion of the resonator conductor portion 550 near the second end 550b, with the dielectric layer 38 interposed between the conductor layer 386 and each of the aforementioned respective portions of the resonator conductor portions 540 and 550. The capacitor C45 shown in FIG. 2 is composed of the conductor layer 386, the resonator conductor portions 540 and 550, and the dielectric layer 38 interposed between the conductor layer 386 and the resonator conductor portions 540 and 550.

Each of the five through hole lines 7T of the first partition 7 is formed by connecting the through holes 7T1, 7T2, 7T3, 7T4, 7T5, 7T8, 7T9 and 7T10 in series in the Z direction.

In the example shown in FIG. 3 to FIG. 11, part of the first partition 7 extends to pass between the second portion 510B of the resonator conductor portion 510 and the second portion 550B of the resonator conductor portion 550, and is in contact with the first portion 61 and the second portion 62.

Each of the five through hole lines 8T of the second partition 8 is formed by connecting the through holes 8T1, 8T2, 8T3, 8T4, 8T5, 8T8, 8T9 and 8T10 in series in the Z direction.

Each of the plurality of through hole lines 63T of the connecting portion 63 is formed by connecting the through holes 63T1, 63T2, 63T3, 63T4, 63T5, 63T8, 63T9 and 63T10 in series in the Z direction.

In the present embodiment, the resonators 51 and 55 which are not adjacent to each other in circuit configuration are magnetically coupled to each other, while the resonators 52 and 54 which are not adjacent to each other in circuit configuration are capacitively coupled to each other. The resonator 51 and the resonator 52 are adjacent to each other in circuit configuration and are also capacitively coupled to each other. The resonator 55 and the resonator 54 are adjacent to each other in circuit configuration and are also capacitively coupled to each other. The resonator conductor portions 510, 520, 540, and 550 of the resonators 51, 52, 54, and 55 having such relationships in circuit configuration have the following physical relationships with each other.

The resonator conductor portion 510 of the resonator 51 and the resonator conductor portion 550 of the resonator 55 are physically adjacent to each other without any resonator conductor portion of another resonator therebetween. In the present embodiment, in particular, the second portion 510B of the resonator conductor portion 510 and the second portion 550B of the resonator conductor portion 550, both of which extend in the Y direction, are physically adjacent to each other in the X direction without any resonator conductor portion of another resonator therebetween. The magnetic coupling between the resonators 51 and 55 is thereby achieved.

The resonator conductor portion 520 of the resonator 52 and the resonator conductor portion 540 of the resonator 54 are physically adjacent to each other without any resonator conductor portion of another resonator therebetween. In the present embodiment, in particular, the first end 520a of the resonator conductor portion 520 and the first end 540a of the resonator conductor portion 540 are at a small distance from each other and adjacent to each other, without any resonator conductor portion of another resonator therebetween. The capacitive coupling between the resonators 52 and 54 is thereby achieved.

The resonator conductor portion 510 of the resonator 51 and the resonator conductor portion 520 of the resonator 52 are physically adjacent to each other without any resonator conductor portion of another resonator therebetween. The capacitive coupling between the resonators 51 and 52 is thereby achieved easily.

The resonator conductor portion 540 of the resonator 54 and the resonator conductor portion 550 of the resonator 55 are physically adjacent to each other without any resonator conductor portion of another resonator therebetween. The capacitive coupling between the resonators 54 and 55 is thereby achieved easily.

The function and effects of the band-pass filter 1 according to the present embodiment will now be described. For example, the band-pass filter 1 is designed and configured to have a passband in a quasi-millimeter wave band of 10 to 30 GHz or a millimeter wave band of 30 to 300 GHz.

The band-pass filter 1 includes the resonators 51, 52, 53, 54 and 55 which are provided between the first input/output port 3 and the second input/output port 4 and arranged in the listed order, from closest to farthest from the first input/output port 3. The resonators 51 to 55 are configured so that electromagnetic coupling, more specifically, capacitive coupling, is established between every two of the resonators adjacent to each other in circuit configuration.

The band-pass filter 1 includes the shield 6. The shield 6 has the function of preventing electromagnetic radiation to the surroundings of the band-pass filter 1. In the present embodiment, the shield 6 and the dielectric inside the shield 6 constitute a structure similar to a waveguide, thereby generating one or more waveguide modes. The one or more waveguide modes usually have resonance frequencies in a frequency region higher than the passband of the band-pass filter 1. If one of the waveguide modes that is the lowest in resonance frequency, i.e., the lowest-order waveguide mode, has a resonance frequency relatively close to the passband of the band-pass filter 1, there occurs the problem that the attenuation characteristic in the frequency region above the passband deteriorates due to unwanted resonance at the resonance frequency of the lowest-order waveguide mode.

The band-pass filter 1 according to the present embodiment prevents the occurrence of the foregoing problem by the provision of the first and second partitions 7 and 8. This will be described in detail below. Assuming that there are no partitions 7 and 8, the resonance frequency of the lowest-order waveguide mode depends on the shape of the space defined by the shield 6. Typically, the larger the space, the lower the resonance frequency of the lowest-order waveguide mode.

In the present embodiment, the first and second partitions 7 and 8 divide the space defined by the shield 6 into a plurality of spaces. Specifically, in the present embodiment, the first partition 7 divides the space defined by the shield 6 into a space in which the resonator conductor portion 510 is located and a space in which the resonator conductor portion 550 is located.

In the present embodiment, the resonance frequency of the lowest-order waveguide mode depends on the shape of each of the plurality of spaces divided by the first and second partitions 7 and 8. Each of these plurality of spaces is smaller than the space defined by the shield 6 in the absence of the partitions 7 and 8. The present invention thus makes the resonance frequency of the lowest-order waveguide mode higher than in the case where there are no partitions 7 and 8. Consequently, the band-pass filter 1 according to the present embodiment prevents the attenuation characteristic in the frequency region above the passband from being degraded by the lowest-order waveguide mode.

In the present embodiment, the first stage resonator 51 and the fifth stage resonator 55, which are not adjacent to each other in circuit configuration, are magnetically coupled to each other. This enables creation of an attenuation pole in at least one of two frequency regions in a frequency response of insertion loss. One of the two frequency regions is a first passband-vicinity region, which is a frequency region close to the passband and lower than the passband, and the other is a second passband-vicinity region, which is a frequency region close to the passband and higher than the passband. Note that the passband is, for example, a frequency band between two frequencies at which the insertion loss becomes higher by 3 dB than its minimum value.

In the present embodiment, specifically, the magnetic coupling between the first stage resonator 51 and the fifth stage resonator 55 creates an attenuation pole in the first passband-vicinity region.

In the present embodiment, the second stage resonator 52 and the fourth stage resonator 54, which are not adjacent to each other in circuit configuration, are capacitively coupled to each other. This enables creation of an attenuation pole in the second passband-vicinity region.

By virtue of these features, the present embodiment provides the band-pass filter 1 which includes the five resonators 51 and 55 and the shield 6 and has favorable characteristics. In the present embodiment, the favorable characteristics of the band-pass filter 1 specifically refer to steep changes in the insertion loss in both of the first and second passband-vicinity regions, and prevention of deterioration in the attenuation characteristic associated with the lowest-order waveguide mode.

In the present embodiment, at least part of the first partition 7 extends to pass between the resonator conductor portion 510 and the resonator conductor portion 550. The resonator conductor portion 510 and the resonator conductor portion 550 respectively constitute the resonator 51 and the resonator 55, which are magnetically coupled to each other although not adjacent to each other in circuit configuration. The magnetic coupling between the resonators 51 and 55 can be weaker than the electromagnetic coupling between any two resonators that are adjacent to each other in circuit configuration. According to the present embodiment, it is thus possible to establish magnetic coupling between the resonators 51 and 55 while disposing the first partition 7 such that at least part thereof passes between the resonator conductor portion 510 and the resonator conductor portion 550. The present embodiment thus achieves both of prevention of deterioration in the attenuation characteristic associated with the lowest-order waveguide mode by the provision of the first partition 7 and the creation of an attenuation pole by establishing magnetic coupling between the resonators 51 and 55. This results in the favorable characteristics of the band-pass filter 1.

Each of the five resonators 51 to 55 in the present embodiment is a half-wave resonator. In this case, each of the resonator conductor portions 510, 520, 530, 540 and 550 may have a harmonic resonance mode in addition to a basic resonance mode, the basic resonance mode having a basic resonance frequency which determines the passband, the harmonic resonance mode having a resonance frequency twice as high as the basic resonance frequency. The harmonic resonance mode may degrade the attenuation characteristic in a frequency region above the passband.

To address this problem, the band-pass filter 1 according to the present embodiment has the notch filter section capable of attenuating signals having a resonance frequency twice as high as the basic resonance frequency. The present embodiment thereby prevents the attenuation characteristic from being degraded by the harmonic resonance mode.

In the present embodiment, the resonator conductor portions 510, 520, 540 and 550 of the resonators 51, 52, 54 and 55 having the above-described relationship in circuit configuration are configured to have the above-described physical relationship. The present embodiment thus realizes the band-pass filter 1 which has two cross couplings and is simple in structure.

Now, an example of characteristics of the band-pass filter 1 according to the present embodiment and an example of characteristics of a band-pass filter of a first comparative example will be discussed. The band-pass filter of the first comparative example has the same configuration as that of the band-pass filter 1 except that the first partition 7 is omitted.

Figure 12:
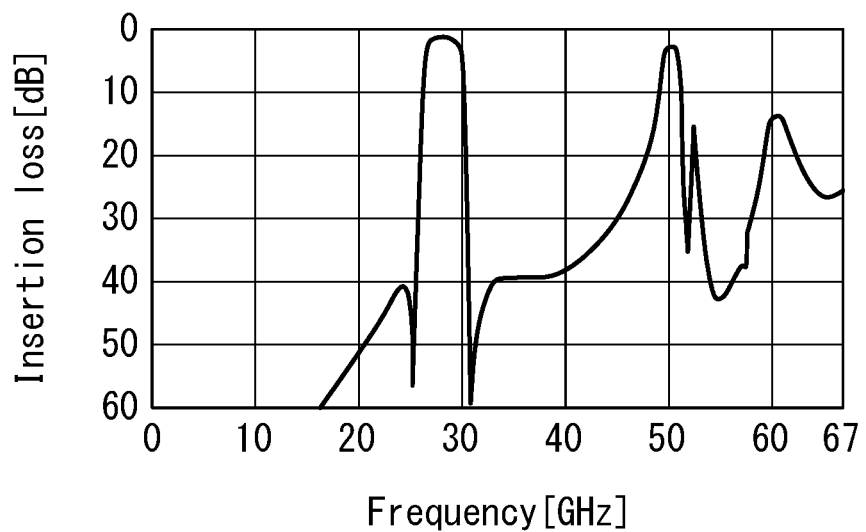
FIG. 12 is a characteristic diagram illustrating an example of the frequency response of the insertion loss of the band-pass filter according to the first embodiment of the invention.
Figure 13:
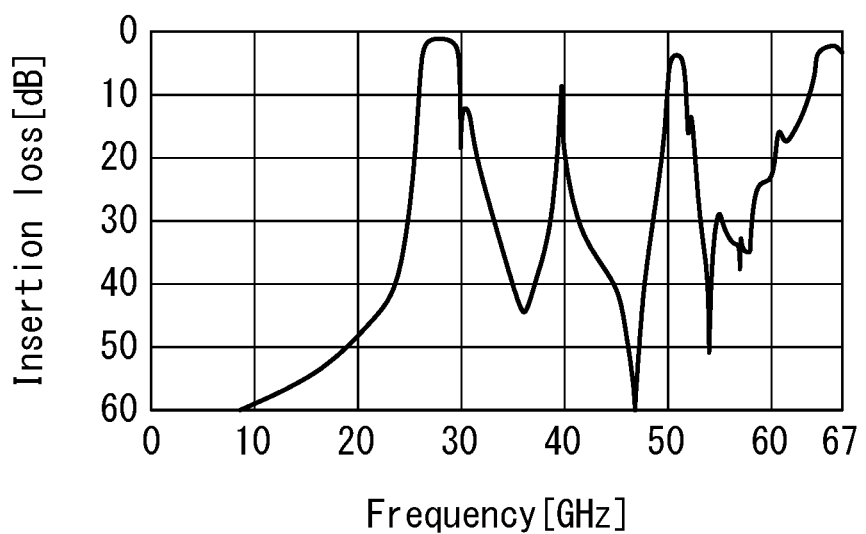
FIG. 13 is a characteristic diagram illustrating an example of the frequency response of the insertion loss of a band-pass filter of a first comparative example.

FIG. 12 illustrates an example frequency response of the insertion loss of the band-pass filter 1 according to the present embodiment. FIG. 13 illustrates an example frequency response of the insertion loss of the band-pass filter of the first comparative example. The frequency responses shown in FIGS. 12 and 13 were obtained by simulation. In FIGS. 12 and 13, the horizontal axis represents frequency, and the vertical axis represents insertion loss. In the examples shown in FIGS. 12 and 13, the band-pass filter 1 and the band-pass filter of the first comparative example have a passband of approximately 26 to 30 GHz, and the center frequency of the passband is approximately 28 GHz.

For the band-pass filter 1 used in the simulation, the magnitudes of the two cross couplings were adjusted, based on the presence of the first partition 7, so as to create attenuation poles in both of the first passband-vicinity region and the second passband-vicinity region, as shown in FIG. 12. The first passband-vicinity region is a frequency region of approximately 24 to 26 GHz. The second passband-vicinity region is a frequency region of approximately 30 to 32 GHz. As illustrated in FIG. 13, the characteristic of the band-pass filter of the first comparative example shows no attenuation pole in the first passband-vicinity region, and shows a lower insertion loss than that of the band-pass filter 1 at an attenuation pole in the second passband-vicinity region. This is because, for the band-pass filter of the first comparative example, the omission of the first partition 7 resulted in a deviation of the magnitude of the magnetic coupling between the resonators 51 and 55 from the adjusted magnitude in the band-pass filter 1.

Further, the characteristic of the band-pass filter of the first comparative example shown in FIG. 13 exhibits a peak of an extreme reduction in the insertion loss at approximately 40 GHz. This is considered to be due to unwanted resonance caused by the lowest-order waveguide mode at approximately 40 GHz. In contrast, the characteristic of the band-pass filter 1 shown in FIG. 12 exhibits no such peak as that occurring in the characteristic shown in FIG. 13, and thus exhibits a better attenuation characteristic in a frequency region above the passband, when compared with the characteristic shown in FIG. 13.

Further, the characteristic of the band-pass filter 1 shown in FIG. 12 exhibits an increase in the insertion loss at approximately 55 GHz. This is due to the effect of the notch filter section.

It is apparent from FIG. 12 that the band-pass filter 1 according to the present embodiment provides the favorable characteristics achieving steep changes in the insertion loss in both of the first and second passband-vicinity regions and prevention of deterioration in the attenuation characteristic associated with the lowest-order waveguide mode.

Second Embodiment

Figure 14:
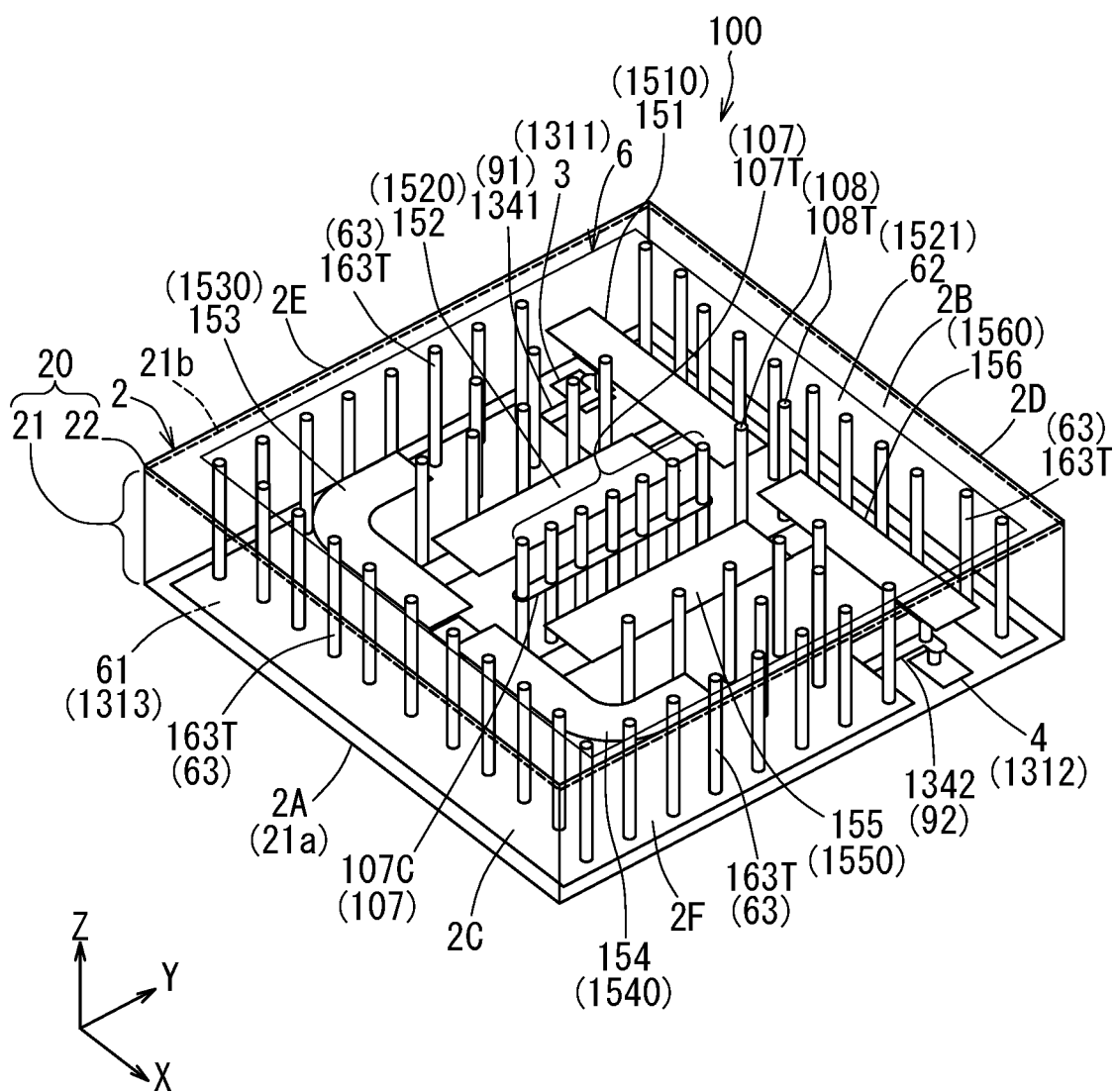
FIG. 14 is a perspective view illustrating the structure of a band-pass filter according to a second embodiment of the invention.
Figure 15:
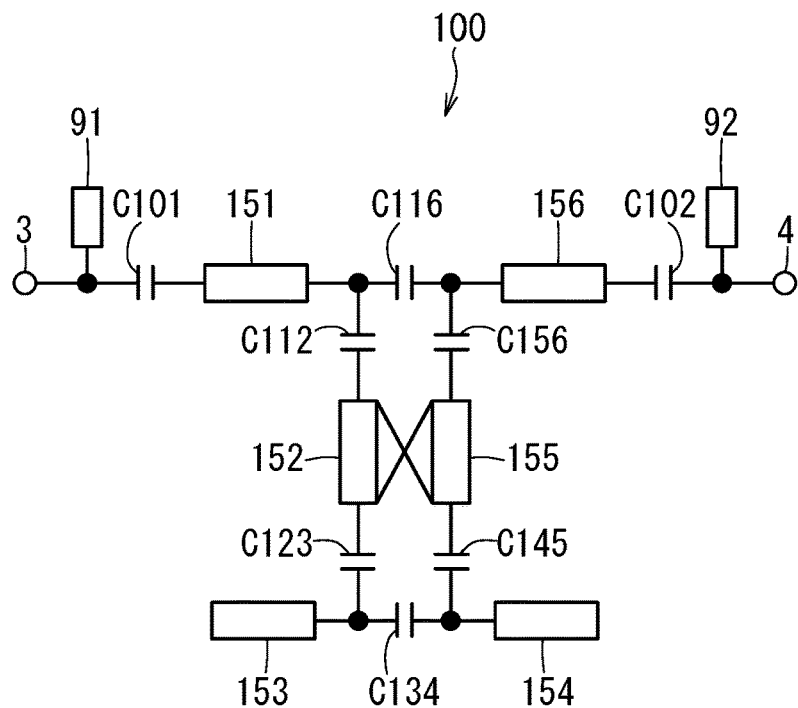
FIG. 15 is a circuit diagram illustrating the circuit configuration of the band-pass filter according to the second embodiment of the invention.

A second embodiment of the present invention will now be described. First, the configuration of a band-pass filter according to the present embodiment will be described with reference to FIG. 14 and FIG. 15. FIG. 14 is a perspective view illustrating the structure of the band-pass filter according to the second embodiment. FIG. 15 is a circuit diagram illustrating the circuit configuration of the band-pass filter according to the second embodiment.

The band-pass filter 100 according to the present embodiment includes the main body 2, the first input/output port 3, the second input/output port 4, three or more resonators, the shield 6, a partition 107, and a coupling adjustment section 108. The main body 2 includes the multilayer stack 20.

The three or more resonators are located between the first input/output port 3 and the second input/output port 4 in circuit configuration. In the present embodiment, the three or more resonators are six resonators 151, 152, 153, 154, 155 and 156. The six resonators 151, 152, 153, 154, 155 and 156 are arranged in this order, from closest to farthest, from the first input/output port 3 in circuit configuration. The six resonators 151 to 156 are configured so that electromagnetic coupling is established between every two of the resonators adjacent to each other in circuit configuration. Specifically, the resonators 151 to 156 are configured so that the resonators 151 and 152 are adjacent to each other in circuit configuration and are electromagnetically coupled to each other, the resonators 152 and 153 are adjacent to each other in circuit configuration and are electromagnetically coupled to each other, the resonators 153 and 154 are adjacent to each other in circuit configuration and are electromagnetically coupled to each other, the resonators 154 and 155 are adjacent to each other in circuit configuration and are electromagnetically coupled to each other, and the resonators 155 and 156 are adjacent to each other in circuit configuration and are electromagnetically coupled to each other. In the present embodiment, the electromagnetic coupling between every two of the resonators adjacent to each other in circuit configuration is specifically capacitive coupling. In the present embodiment, each of the resonators 151 to 156 is a resonator with open ends, and also a half-wave resonator.

The first portion 61, the second portion 62 and the connecting portion 63 of the shield 6 are arranged to surround the six resonators 151 to 156. The first portion 61 is formed of a first conductor layer 1313 disposed on the first end face 21a of the main portion 21 of the multilayer stack 20. The second portion 62 is formed of a second conductor layer 1521 disposed on the second end face 21b of the main portion 21 of the multilayer stack 20.

The band-pass filter 100 includes a capacitor C112 for establishing capacitive coupling between the resonators 151 and 152, a capacitor C123 for establishing capacitive coupling between the resonators 152 and 153, a capacitor C134 for establishing capacitive coupling between the resonators 153 and 154, a capacitor C145 for establishing capacitive coupling between the resonators 154 and 155, and a capacitor C156 for establishing capacitive coupling between the resonators 155 and 156.

In the present embodiment, among the six resonators 151 to 156, the resonator 152, which is the second closest to the first input/output port 3 in circuit configuration, and the resonator 155, which is the second closest to the second input/output port 4 in circuit configuration, are magnetically coupled to each other although they are not adjacent to each other in circuit configuration. The resonator 152 corresponds to the first resonator in the present invention. The resonator 155 corresponds to the second resonator in the present invention.

Further, in the present embodiment, among the six resonators 151 to 156, the resonator 151, which is the closest to the first input/output port 3 in circuit configuration, and the resonator 156, which is the closest to the second input/output port 4 in circuit configuration, are capacitively coupled to each other although they are not adjacent to each other in circuit configuration. In FIG. 15, the capacitor symbol C116 represents the capacitive coupling between the resonators 151 and 156.

The band-pass filter 100 further includes a capacitor C101 provided between the first input/output port 3 and the resonator 151, and a capacitor C102 provided between the second input/output port 4 and the resonator 156.

The band-pass filter 100 further includes the two lines 91 and 92 as in the first embodiment.

The resonator 151 includes a resonator conductor portion 1510 formed of a conductor. The resonator 152 includes a resonator conductor portion 1520 formed of a conductor. The resonator 153 includes a resonator conductor portion 1530 formed of a conductor. The resonator 154 includes a resonator conductor portion 1540 formed of a conductor. The resonator 155 includes a resonator conductor portion 1550 formed of a conductor. The resonator 156 includes a resonator conductor portion 1560 formed of a conductor. The resonator conductor portion 1520 corresponds to the first resonator conductor portion in the present invention. The resonator conductor portion 1550 corresponds to the second resonator conductor portion in the present invention.

Each of the resonator conductor portions 1510, 1520, 1530, 1540, 1550 and 1560 extends in a direction intersecting the first direction or the Z direction. In the present embodiment, specifically, each of the resonator conductor portions 1510, 1520, 1530, 1540, 1550 and 1560 extends in a direction orthogonal to the first direction or the Z direction.

Each of the resonator conductor portions 1510, 1520, 1530, 1540, 1550 and 1560 has a first end and a second end opposite to each other. As mentioned above, each of the resonators 151 to 156 is a resonator with open ends. Thus, both of the first and second ends of each of the resonator conductor portions 1510, 1520, 1530, 1540, 1550 and 1560 are open. Each of the resonator conductor portions 1510, 1520, 1530, 1540, 1550 and 1560 has a length of one half or nearly one half the wavelength corresponding to the center frequency of the passband of the band-pass filter 100.

The partition 107 is in contact with the first portion 61 and the second portion 62. At least part of the partition 107 extends to pass between the resonator conductor portion 1520 and the resonator conductor portion 1550. In the present embodiment, specifically, the partition 107 extends in the first direction, i.e., the Z direction. The partition 107 connects the first portion 61 and the second portion 62 via the shortest path. To be more specific, the length of the partition 107 in the Z direction is equal to the distance between the first portion 61 and the second portion 62.

The partition 107 runs through the two or more dielectric layers constituting the main portion 21. In the present embodiment, the partition 107 includes a plurality of through hole lines 107T each running through the two or more dielectric layers constituting the main portion 21, and includes a conductor layer 107C. The plurality of through hole lines 107T correspond to the plurality of first through hole lines in the present invention. In FIG. 14, each through hole line 107T is represented by a circular column. Each of the through hole lines 107T includes two or more through holes connected in series. Each of the through hole lines 107T extends in the Z direction. The through hole lines 107T are arranged to be adjacent to each other in the Y direction. In the present embodiment, the number of the through hole lines 107T is seven.

The coupling adjustment section 108 is intended to adjust the magnitude of the capacitive coupling between the resonators 151 and 156. The coupling adjustment section 108 includes a plurality of through hole lines 108T each running through the two or more dielectric layers constituting the main portion 21. In FIG. 14, each through hole line 108T is represented by a circular column. Each of the through hole lines 108T includes two or more through holes connected in series. Each of the through hole lines 108T extends in the Z direction and is in contact with the first portion 61 and the second portion 62. The through hole lines 108T are arranged to be adjacent to each other in the Y direction in the vicinity of the second end of the resonator conductor portion 1510 and the second end of the resonator conductor portion 1560. In the present embodiment, the number of the through hole lines 108T is two.

The connecting portion 63 of the shield 6 includes a plurality of through hole lines 163T each running through the two or more dielectric layers constituting the main portion 21. The plurality of through hole lines 163T correspond to the second through hole lines in the present invention. In FIG. 14, each through hole line 163T is represented by a circular column. All the through hole lines represented by circular columns in FIG. 14, except the seven through hole lines 107T and the two through hole lines 108T, are the through hole lines 163T. Each of the through hole lines 163T includes two or more through holes connected in series. Each of the through hole lines 163T extends in the Z direction.

Reference is now made to FIG. 16 to FIG. 24 to describe an example of a plurality of dielectric layers constituting the multilayer stack 20 and the configuration of a plurality of conductor layers formed on the dielectric layers and a plurality of through holes formed in the dielectric layers. In this example, the multilayer stack 20 includes twenty-two dielectric layers stacked together. The twenty-two dielectric layers will be referred to as the first to twenty-second dielectric layers in the order from bottom to top. The first to twenty-second dielectric layers are denoted by reference numerals 131 to 152, respectively. The main portion 21 is composed of the first to twenty-first dielectric layers 131 to 151. The coating portion 22 is composed of the twenty-second dielectric layer 152. In FIG. 16 to FIG. 23, each circle represents a through hole.

Figure 16:
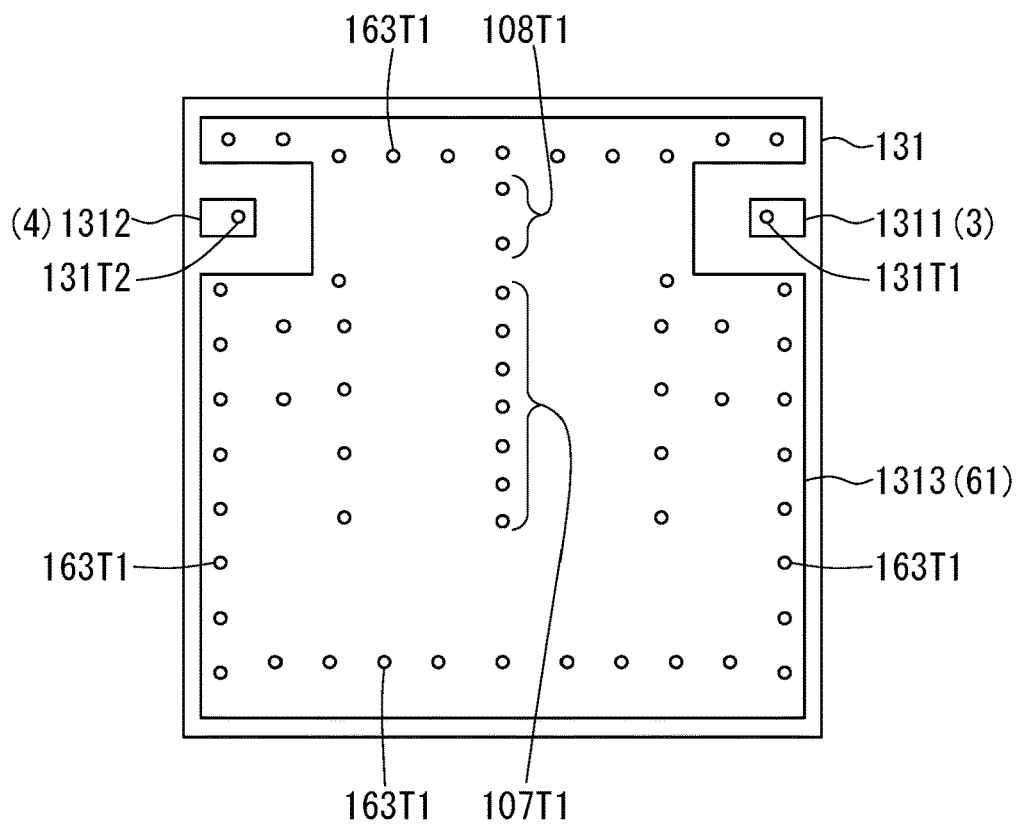
FIG. 16 is an explanatory diagram illustrating a patterned surface of a first dielectric layer of the multilayer stack shown in FIG. 14.

FIG. 16 illustrates a patterned surface of the first dielectric layer 131. On the patterned surface of the first dielectric layer 131, there are formed a conductor layer 1311 forming the first input/output port 3, a conductor layer 1312 forming the second input/output port 4, and the first conductor layer 1313 forming the first portion 61 of the shield 6.

Further, a through hole 131T1 connected to the conductor layer 1311, and a through hole 131T2 connected to the conductor layer 1312 are formed in the dielectric layer 131. Further formed in the dielectric layer 131 are seven through holes 107T1 constituting respective portions of the seven through hole lines 107T, two through holes 108T1 constituting respective portions of the two through hole lines 108T, and a plurality of through holes 163T1 constituting respective portions of the plurality of through hole lines 163T. All the through holes represented by circles in FIG. 16, except the through holes 131T1, 131T2, 107T1 and 108T1, are the through holes 163T1. The through holes 107T1, 108T1 and 163T1 are connected to the first conductor layer 1313.

Figure 17:
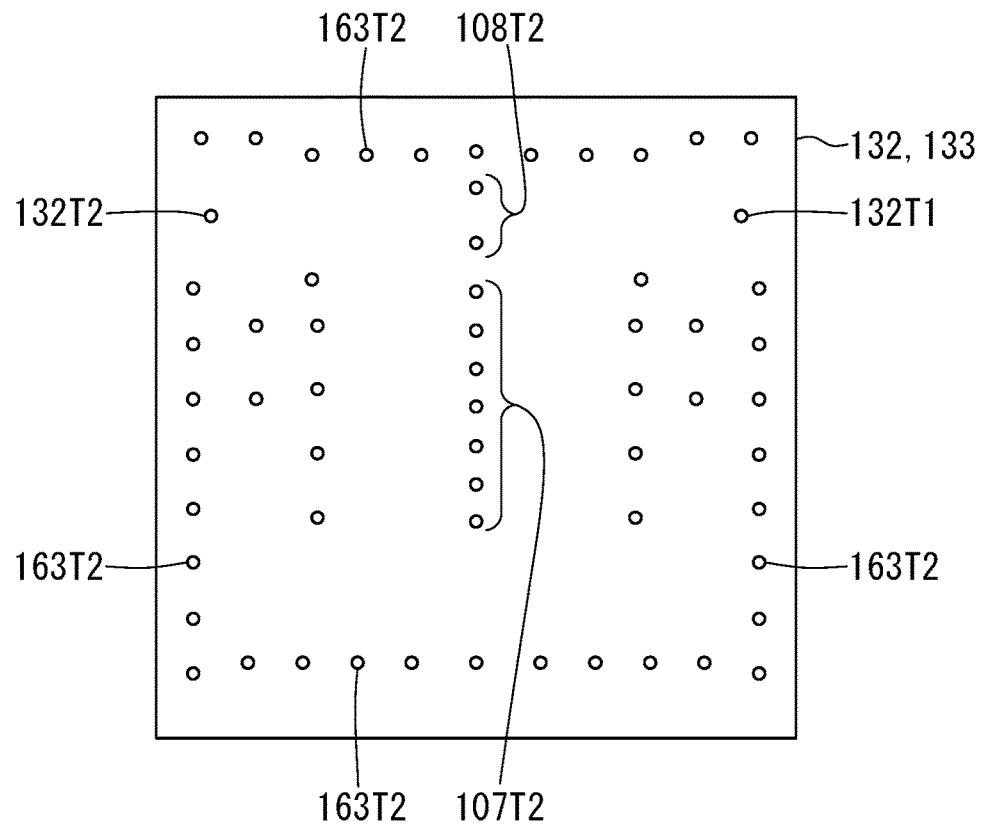
FIG. 17 is an explanatory diagram illustrating a patterned surface of each of a second and a third dielectric layer of the multilayer stack shown in FIG. 14.

FIG. 17 illustrates a patterned surface of each of the second and third dielectric layers 132 and 133. Through holes 132T1 and 132T2 are formed in each of the dielectric layers 132 and 133. The through holes 131T1 and 131T2 shown in FIG. 16 are connected to the through holes 132T1 and 132T2, respectively.

In each of the dielectric layers 132 and 133, there are further formed seven through holes 107T2 constituting respective portions of the seven through hole lines 107T. The seven through holes 107T1 shown in FIG. 16 are respectively connected to the seven through holes 107T2 formed in the second dielectric layer 132.

In each of the dielectric layers 132 and 133, there are further formed two through holes 108T2 constituting respective portions of the two through hole lines 108T. The two through holes 108T1 shown in FIG. 16 are respectively connected to the two through holes 108T2 formed in the second dielectric layer 132.

Further, a plurality of through holes 163T2 constituting respective portions of the plurality of through hole lines 163T are formed in each of the dielectric layers 132 and 133. All the through holes represented by circles in FIG. 17, except the through holes 132T1, 132T2, 107T2 and 108T2, are the through holes 163T2. The plurality of through holes 163T1 shown in FIG. 16 are respectively connected to the plurality of through holes 163T2 formed in the second dielectric layer 132.

In the dielectric layers 132 and 133, every vertically adjacent through holes denoted by the same reference signs are connected to each other.

Figure 18:
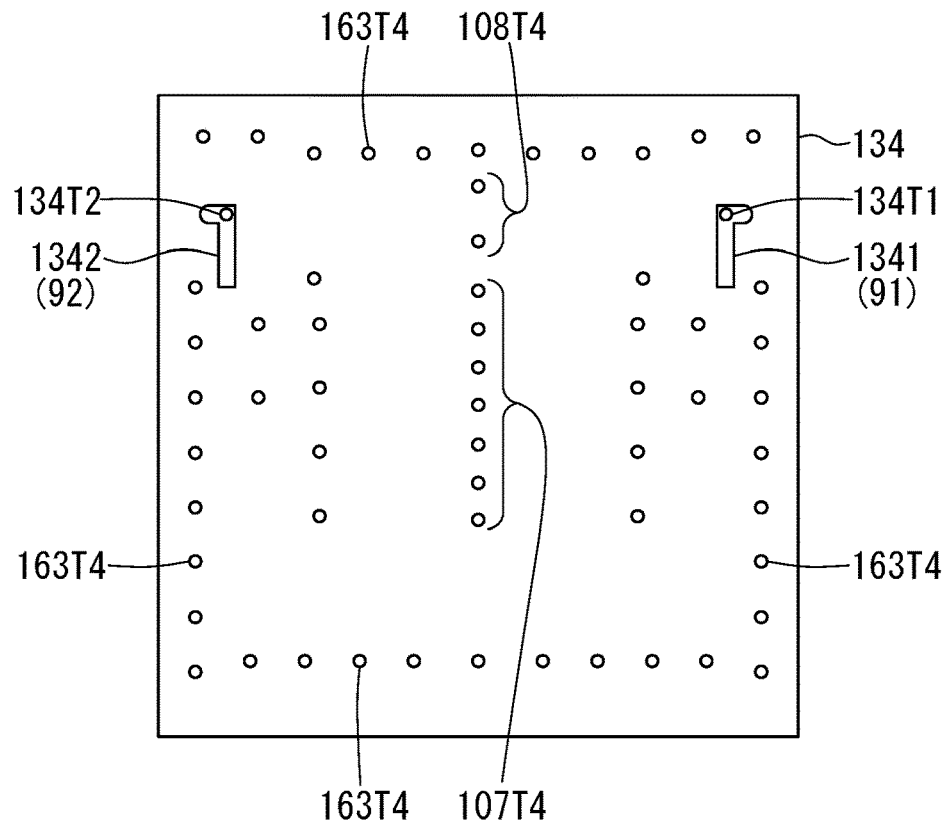
FIG. 18 is an explanatory diagram illustrating a patterned surface of a fourth dielectric layer of the multilayer stack shown in FIG. 14.

FIG. 18 illustrates a patterned surface of the fourth dielectric layer 134. On the patterned surface of the dielectric layer 134, there are formed a conductor layer 1341 forming the line 91 and a conductor layer 1342 forming the line 92. Each of the conductor layers 1341 and 1342 has a first end and a second end opposite to each other. The through hole 132T1 formed in the third dielectric layer 133 is connected to a portion of the conductor layer 1341 near the first end thereof. The through hole 132T2 formed in the third dielectric layer 133 is connected to a portion of the conductor layer 1342 near the first end thereof. A portion of the conductor layer 1341 near the second end thereof and a portion of the conductor layer 1342 near the second end thereof are opposed to the conductor layer 1313 shown in FIG. 16 with the dielectric layers 131, 132 and 133 interposed between the conductor layer 1313 and each of the aforementioned portions of the conductor layers 1341 and 1342.

Further formed in the dielectric layer 134 are a through hole 134T1 connected to the portion of the conductor layer 1341 near the first end thereof, and a through hole 134T2 connected to the portion of the conductor layer 1342 near the first end thereof.

Further, seven through holes 107T4 constituting respective portions of the seven through hole lines 107T are formed in the dielectric layer 134. The seven through holes 107T2 formed in the third dielectric layer 133 are connected to the seven through holes 107T4, respectively.

Further formed in the dielectric layer 134 are two through holes 108T4 constituting respective portions of the two through hole lines 108T. The two through holes 108T2 formed in the third dielectric layer 133 are connected to the two through holes 108T4, respectively.

Further formed in the dielectric layer 134 are a plurality of through holes 163T4 constituting respective portions of the plurality of through hole lines 163T. All the through holes represented by circles in FIG. 18, except the through holes 134T1, 134T2, 107T4 and 108T4, are the through holes 163T4. The plurality of through holes 163T2 formed in the third dielectric layer 133 are connected to the plurality of through holes 163T4, respectively.

Figure 19:
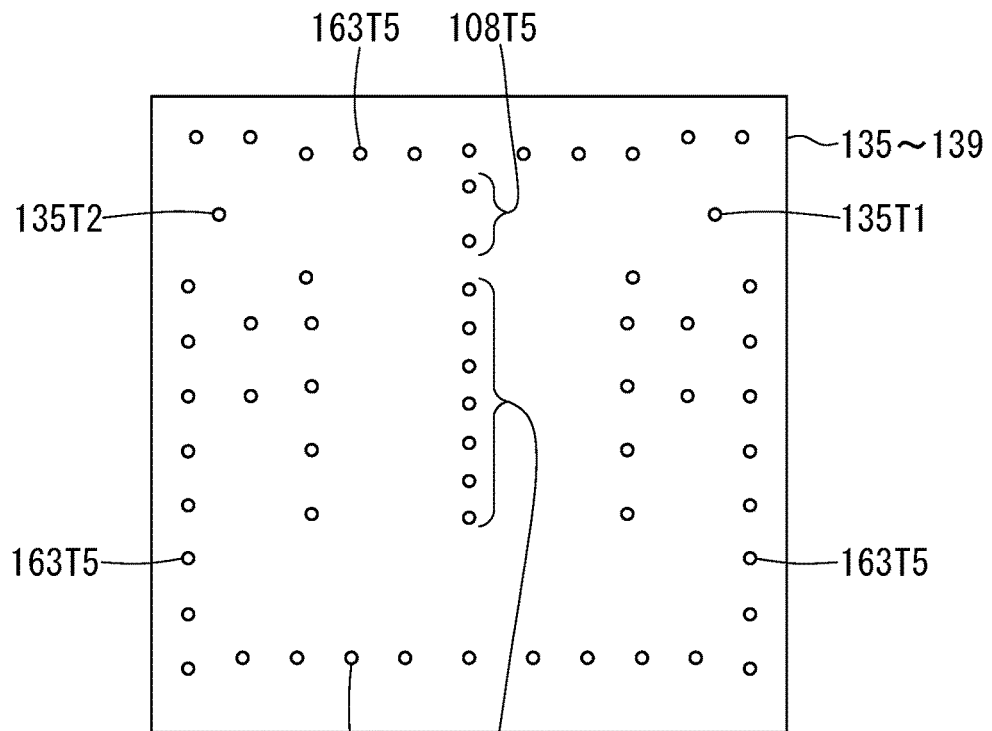
FIG. 19 is an explanatory diagram illustrating a patterned surface of each of a fifth to a ninth dielectric layer of the multilayer stack shown in FIG. 14.

FIG. 19 illustrates a patterned surface of each of the fifth to ninth dielectric layers 135 to 139. Through holes 135T1 and 135T2 are formed in each of the dielectric layers 135 to 139. The through holes 134T1 and 134T2 shown in FIG. 18 are respectively connected to the through holes 135T1 and 135T2 formed in the fifth dielectric layer 135.

In each of the dielectric layers 135 to 139, there are further formed seven through holes 107T5 constituting respective portions of the seven through hole lines 107T. The seven through holes 107T4 shown in FIG. 18 are respectively connected to the seven through holes 107T5 formed in the fifth dielectric layer 135.

In each of the dielectric layers 135 to 139, there are further formed two through holes 108T5 constituting respective portions of the two through hole lines 108T. The two through holes 108T4 shown in FIG. 18 are respectively connected to the two through holes 108T5 formed in the fifth dielectric layer 135.

Further, a plurality of through holes 163T5 constituting respective portions of the plurality of through hole lines 163T are formed in each of the dielectric layers 135 to 139. All the through holes represented by circles in FIG. 19, except the through holes 135T1, 135T2, 107T5 and 108T5, are the through holes 163T5. The plurality of through holes 163T4 shown in FIG. 18 are respectively connected to the plurality of through holes 163T5 formed in the fifth dielectric layer 135.

In the dielectric layers 135 to 139, every vertically adjacent through holes denoted by the same reference signs are connected to each other.

Figure 20:
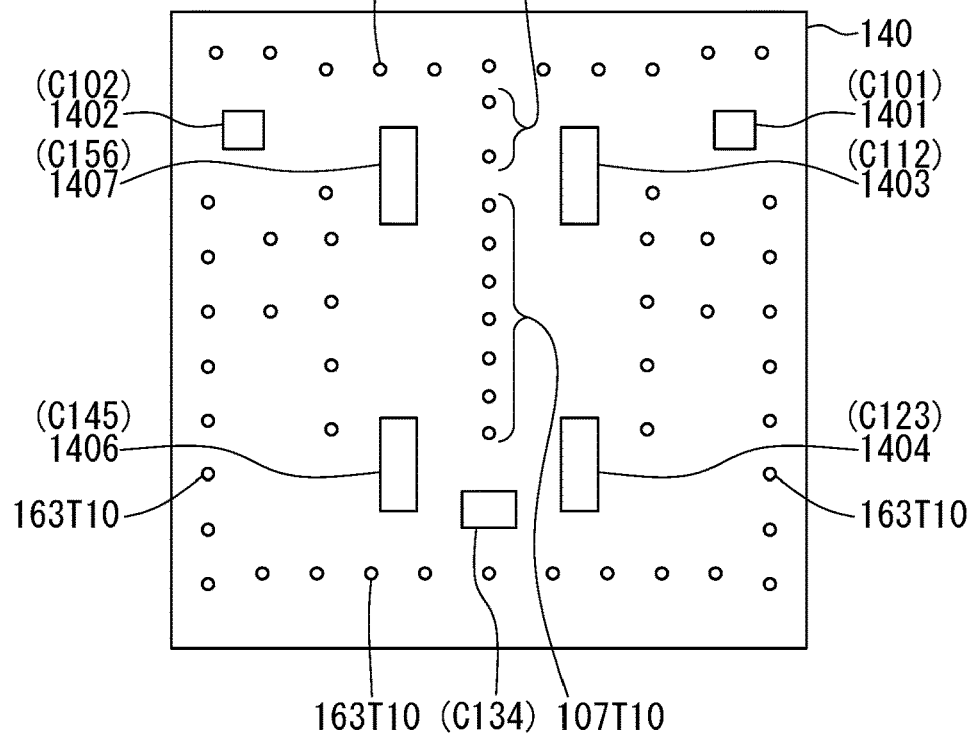
FIG. 20 is an explanatory diagram illustrating a patterned surface of a tenth dielectric layer of the multilayer stack shown in FIG. 14.

FIG. 20 illustrates a patterned surface of the tenth dielectric layer 140. On the patterned surface of the dielectric layer 140, there are formed a conductor layer 1401 for forming the capacitor C101 shown in FIG. 15 and a conductor layer 1402 for forming the capacitor C102 shown in FIG. 15. The through hole 135T1 formed in the ninth dielectric layer 139 is connected to the conductor layer 1401. The through hole 135T2 formed in the ninth dielectric layer 139 is connected to the conductor layer 1402.

On the patterned surface of the dielectric layer 140, there are further formed conductor layers 1403, 1404, 1405, 1406 and 1407 for forming the capacitors C112, C123, C134, C145 and C156 shown in FIG. 15, respectively.

Further, seven through holes 107T10 constituting respective portions of the seven through hole lines 107T are formed in the dielectric layer 140. The seven through holes 107T5 formed in the ninth dielectric layer 139 are connected to the seven through holes 107T10, respectively.

Further formed in the dielectric layer 140 are two through holes 108T10 constituting respective portions of the two through hole lines 108T. The two through holes 108T5 formed in the ninth dielectric layer 139 are connected to the two through holes 108T10, respectively.

Further formed in the dielectric layer 140 are a plurality of through holes 163T10 constituting respective portions of the plurality of through hole lines 163T. All the through holes represented by circles in FIG. 20, except the through holes 107T10 and 108T10, are the through holes 163T10. The plurality of through holes 163T5 formed in the ninth dielectric layer 139 are connected to the plurality of through holes 163T10, respectively.

Figure 21:
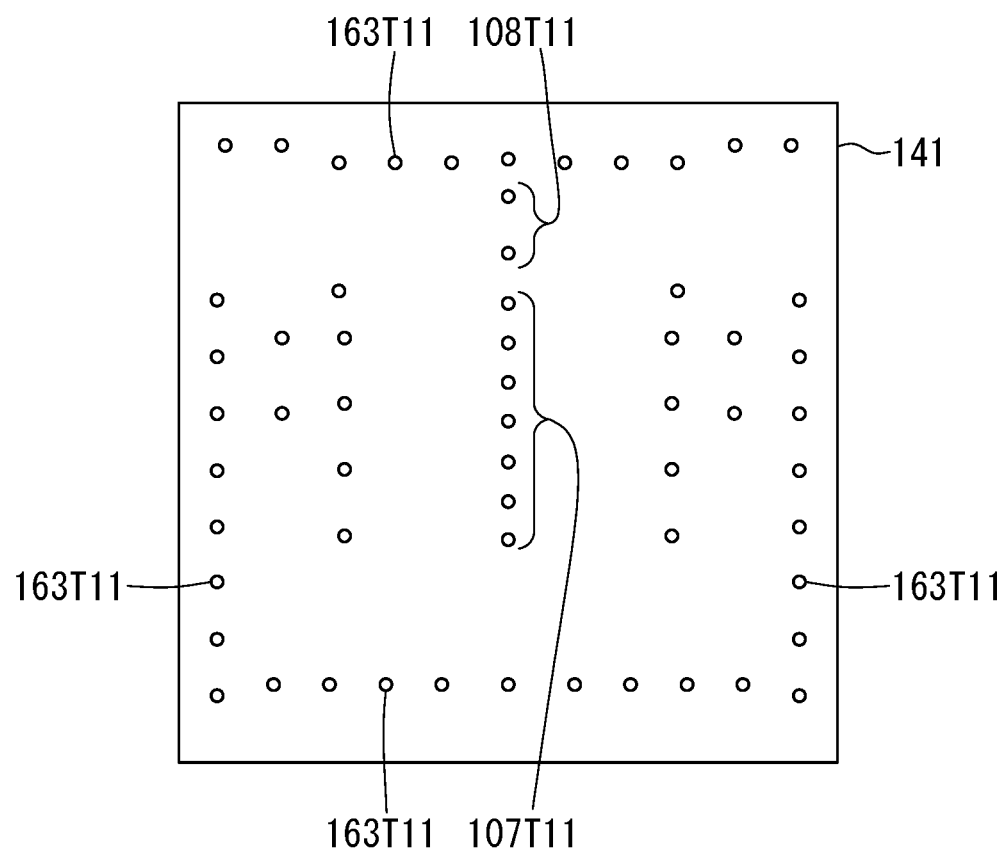
FIG. 21 is an explanatory diagram illustrating a patterned surface of an eleventh dielectric layer of the multilayer stack shown in FIG. 14.

FIG. 21 illustrates a patterned surface of the eleventh dielectric layer 141. In the dielectric layer 141, there are formed seven through holes 107T11 constituting respective portions of the seven through hole lines 107T. The seven through holes 107T10 shown in FIG. 20 are connected to the seven through holes 107T11, respectively.

Further formed in the dielectric layer 141 are two through holes 108T11 constituting respective portions of the two through hole lines 108T. The two through holes 108T10 shown in FIG. 20 are connected to the two through holes 108T11, respectively.

Further formed in the dielectric layer 141 are a plurality of through holes 163T11 constituting respective portions of the plurality of through hole lines 163T. All the through holes represented by circles in FIG. 21, except the through holes 107T11 and 108T11, are the through holes 163T11. The plurality of through holes 163T10 shown in FIG. 20 are connected to the plurality of through holes 163T11, respectively.

Figure 22:
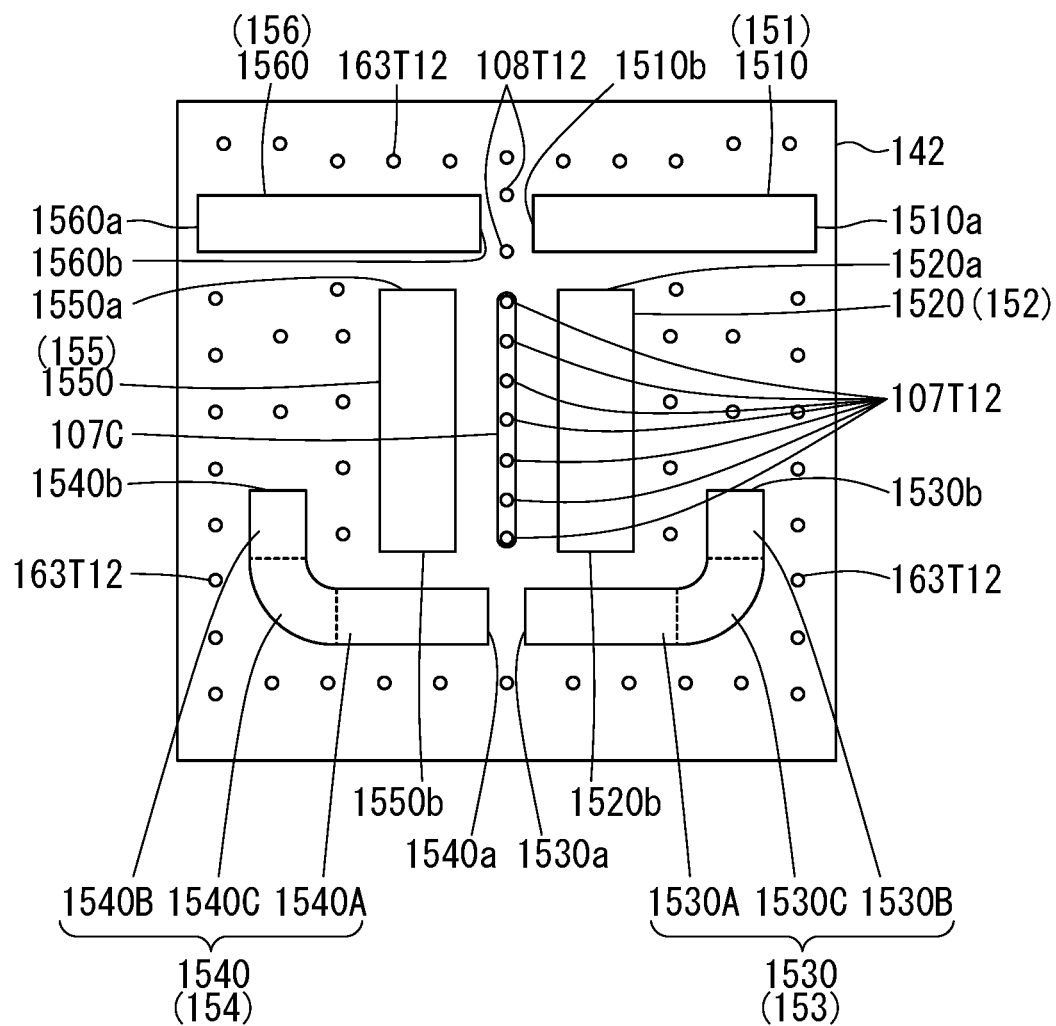
FIG. 22 is an explanatory diagram illustrating a patterned surface of a twelfth dielectric layer of the multilayer stack shown in FIG. 14.

FIG. 22 illustrates a patterned surface of the twelfth dielectric layer 142. The resonator conductor portions 1510, 1520, 1530, 1540, 1550 and 1560 are formed on the patterned surface of the dielectric layer 142.

The resonator conductor portion 1510 has a first end 1510a and a second end 1510b opposite to each other. The resonator conductor portion 1520 has a first end 1520a and a second end 1520b opposite to each other. The resonator conductor portion 1530 has a first end 1530a and a second end 1530b opposite to each other. The resonator conductor portion 1540 has a first end 1540a and a second end 1540b opposite to each other. The resonator conductor portion 1550 has a first end 1550a and a second end 1550b opposite to each other. The resonator conductor portion 1560 has a first end 1560a and a second end 1560b opposite to each other.

Each of the resonator conductor portions 1510 and 1560 extends in the X direction. The resonator conductor portions 1510 and 1560 are arranged in such a positional relationship that one straight line extends across the resonator conductor portions 1510 and 1560 in the X direction. The second end 1510b of the resonator conductor portion 1510 and the second end 1560b of the resonator conductor portion 1560 are at a predetermined distance from each other and adjacent to each other. The distance between the second end 1510b and the second end 1560b is sufficiently smaller than the length of each of the resonator conductor portions 1510 and 1560.

Each of the resonator conductor portions 1520 and 1550 extends in the Y direction. The resonator conductor portions 1520 and 1550 are at a predetermined distance from each other and adjacent to each other in the X direction. The distance between the resonator conductor portions 1520 and 1550 is smaller than the length of each of the resonator conductor portions 1520 and 1550.

The first end 1520a of the resonator conductor portion 1520 is located near the second end 1510b of the resonator conductor portion 1510. The first end 1550a of the resonator conductor portion 1550 is located near the second end 1560b of the resonator conductor portion 1560.

The resonator conductor portion 1530 includes a first portion 1530A, a second portion 1530B and a third portion 1530C. The first portion 1530A includes the first end 1530a, and the second portion 1530B includes the second end 1530b. The first portion 1530A extends in the X direction, and the second portion 1530B extends in the Y direction. The third portion 1530C connects an end of the first portion 1530A opposite from the first end 1530a and an end of the second portion 1530B opposite from the second end 1530b. In FIG. 22, the boundary between the first portion 1530A and the third portion 1530C and the boundary between the second portion 1530B and the third portion 1530C are shown by broken lines. The first end 1530a is located near the second end 1520b of the resonator conductor portion 1520.

The resonator conductor portion 1540 includes a first portion 1540A, a second portion 1540B and a third portion 1540C. The first portion 1540A includes the first end 1540a, and the second portion 1540B includes the second end 1540b. The first portion 1540A extends in the X direction, and the second portion 1540B extends in the Y direction. The third portion 1540C connects an end of the first portion 1540A opposite from the first end 1540a and an end of the second portion 1540B opposite from the second end 1540b. In FIG. 22, the boundary between the first portion 1540A and the third portion 1540C and the boundary between the second portion 1540B and the third portion 1540C are shown by broken lines. The first end 1540a is located near the second end 1550b of the resonator conductor portion 1550.

The first end 1530a of the resonator conductor portion 1530 and the first end 1540a of the resonator conductor portion 1540 are at a predetermined distance from each other and adjacent to each other.

The conductor layer 107C constituting part of the partition 107 is further formed on the patterned surface of the dielectric layer 142. The conductor layer 107C is situated between the resonator conductor portion 1520 and the resonator conductor portion 1550, and extends in the Y direction.

Further, seven through holes 107T12 constituting respective portions of the seven through hole lines 107T are formed in the dielectric layer 142. The seven through holes 107T12 are connected to the conductor layer 107C. The seven through holes 107T11 shown in FIG. 21 are connected to the seven through holes 107T12, respectively.

Further formed in the dielectric layer 142 are two through holes 108T12 constituting respective portions of the two through hole lines 108T. The two through holes 108T11 shown in FIG. 21 are connected to the two through holes 108T12, respectively.

Further formed in the dielectric layer 142 are a plurality of through holes 163T12 constituting respective portions of the plurality of through hole lines 163T. All the through holes represented by circles in FIG. 22, except the through holes 107T12 and 108T12, are the through holes 163T12. The plurality of through holes 163T11 shown in FIG. 21 are connected to the plurality of through holes 163T12, respectively.

Figure 23:
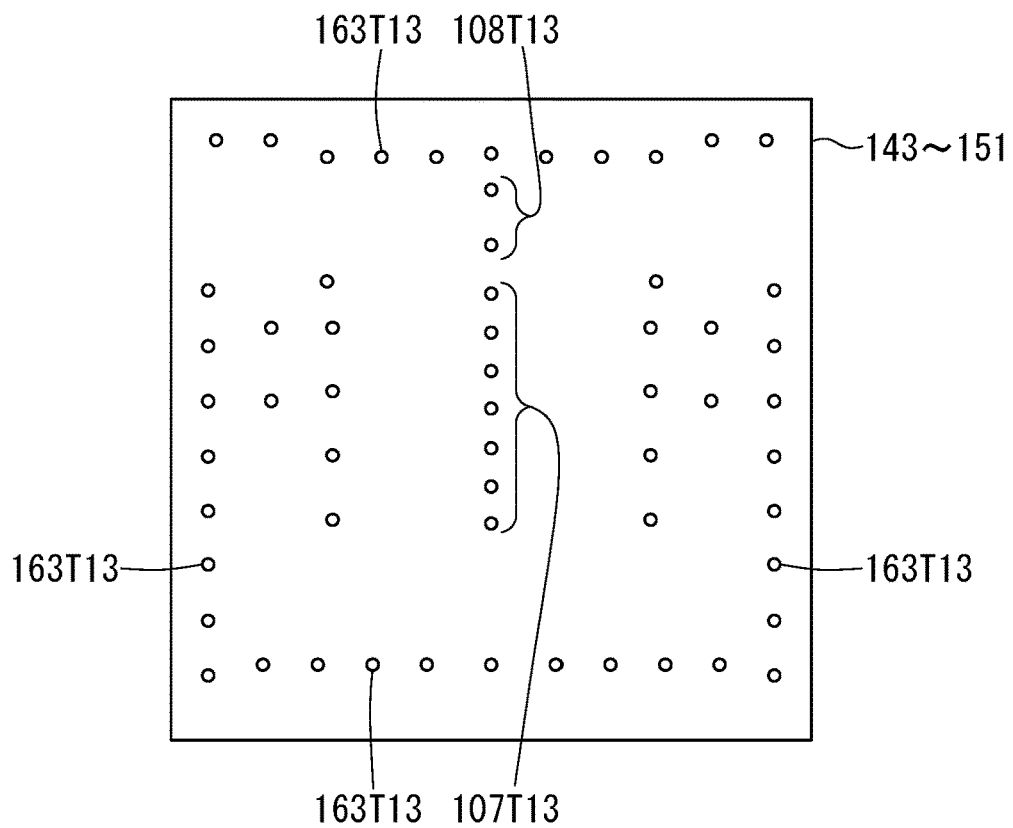
FIG. 23 is an explanatory diagram illustrating a patterned surface of each of a thirteenth to a twenty-first dielectric layer of the multilayer stack shown in FIG. 14.

FIG. 23 illustrates a patterned surface of each of the thirteenth to twenty-first dielectric layers 143 to 151. Seven through holes 107T13 constituting respective portions of the seven through hole lines 107T are formed in each of the dielectric layers 143 to 151. The seven through holes 107T12 shown in FIG. 22 are respectively connected to the seven through holes 107T13 formed in the thirteenth dielectric layer 143.

In each of the dielectric layers 143 to 151, there are further formed two through holes 108T13 constituting respective portions of the two through hole lines 108T. The two through holes 108T12 shown in FIG. 22 are respectively connected to the two through holes 108T13 formed in the thirteenth dielectric layer 143.

Further, a plurality of through holes 163T13 constituting respective portions of the plurality of through hole lines 163T are formed in each of the dielectric layers 143 to 151. All the through holes represented by circles in FIG. 23, except the through holes 107T13 and 108T13, are the through holes 163T13. The plurality of through holes 163T12 shown in FIG. 22 are respectively connected to the plurality of through holes 163T13 formed in the thirteenth dielectric layer 143.

In the dielectric layers 143 to 151, every vertically adjacent through holes denoted by the same reference signs are connected to each other.

Figure 24:
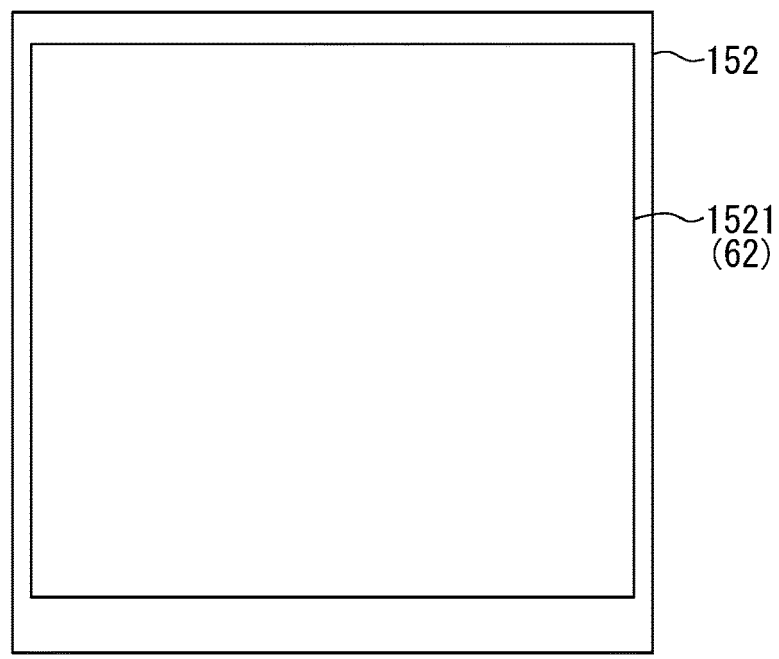
FIG. 24 is an explanatory diagram illustrating a patterned surface of a twenty-second dielectric layer of the multilayer stack shown in FIG. 14.

FIG. 24 illustrates a patterned surface of the twenty-second dielectric layer 152. The second conductor layer 1521 forming the second portion 62 of the shield 6 is formed on the patterned surface of the dielectric layer 152. The through holes 107T13, 108T13 and 163T13 formed in the twenty-first dielectric layer 151 are connected to the second conductor layer 1521.

The band-pass filter 100 according to the present embodiment is formed by stacking the first to twenty-second dielectric layers 131 to 152 such that the patterned surface of the first dielectric layer 131 also serves as the first end face 2A of the main body 2. A surface of the twenty-second dielectric layer 152 opposite to the patterned surface serves as the second end face 2B of the main body 2. The first to twenty-second dielectric layers 131 to 152 constitute the multilayer stack 20.

The respective resonator conductor portions 1510, 1520, 1530, 1540, 1550 and 1560 of the resonators 151 to 156 are located at the same position in the multilayer stack 20 in the first direction, i.e., the Z direction.

The conductor layer 1311 forming the first input/output port 3 is connected to the conductor layer 1401 shown in FIG. 20 via the through holes 131T1, 132T1, 134T1 and 135T1. The conductor layer 1401 is opposed to a portion of the resonator conductor portion 1510 (FIG. 22) near the first end 1510a with the dielectric layers 140 and 141 interposed therebetween. The capacitor C101 shown in FIG. 15 is composed of the conductor layer 1401 and the resonator conductor portion 1510, and also the dielectric layers 140 and 141 interposed therebetween.

The conductor layer 1312 forming the second input/output port 4 is connected to the conductor layer 1402 shown in FIG. 20 via the through holes 131T2, 132T2, 134T2 and 135T2. The conductor layer 1402 is opposed to a portion of the resonator conductor portion 1560 (FIG. 22) near the first end 1560a with the dielectric layers 140 and 141 interposed therebetween. The capacitor C102 shown in FIG. 15 is composed of the conductor layer 1402 and the resonator conductor portion 1560, and also the dielectric layers 140 and 141 interposed therebetween.

The conductor layer 1403 shown in FIG. 20 is opposed to a portion of the resonator conductor portion 1510 near the second end 1510b and to a portion of the resonator conductor portion 1520 near the first end 1520a, with the dielectric layers 140 and 141 interposed between the conductor layer 1403 and each of the aforementioned respective portions of the resonator conductor portions 1510 and 1520. The capacitor C112 shown in FIG. 15 is composed of the conductor layer 1403, the resonator conductor portions 1510 and 1520, and the dielectric layers 140 and 141 interposed between the conductor layer 1403 and the resonator conductor portions 1510 and 1520.

The conductor layer 1404 shown in FIG. 20 is opposed to a portion of the resonator conductor portion 1520 near the second end 1520b and to a portion of the resonator conductor portion 1530 near the first end 1530a, with the dielectric layers 140 and 141 interposed between the conductor layer 1404 and each of the aforementioned respective portions of the resonator conductor portions 1520 and 1530. The capacitor C123 shown in FIG. 15 is composed of the conductor layer 1404, the resonator conductor portions 1520 and 1530, and the dielectric layers 140 and 141 interposed between the conductor layer 1404 and the resonator conductor portions 1520 and 1530.

The conductor layer 1405 shown in FIG. 20 is opposed to a portion of the resonator conductor portion 1530 near the first end 1530a and to a portion of the resonator conductor portion 1540 near the first end 1540a, with the dielectric layers 140 and 141 interposed between the conductor layer 1405 and each of the aforementioned respective portions of the resonator conductor portions 1530 and 1540. The capacitor C134 shown in FIG. 15 is composed of the conductor layer 1405, the resonator conductor portions 1530 and 1540, and the dielectric layers 140 and 141 interposed between the conductor layer 1405 and the resonator conductor portions 1530 and 1540.

The conductor layer 1406 shown in FIG. 20 is opposed to a portion of the resonator conductor portion 1540 near the first end 1540a and to a portion of the resonator conductor portion 1550 near the second end 1550b, with the dielectric layers 140 and 141 interposed between the conductor layer 1406 and each of the aforementioned respective portions of the resonator conductor portions 1540 and 1550. The capacitor C145 shown in FIG. 15 is composed of the conductor layer 1406, the resonator conductor portions 1540 and 1550, and the dielectric layers 140 and 141 interposed between the conductor layer 1406 and the resonator conductor portions 1540 and 1550.

The conductor layer 1407 shown in FIG. 20 is opposed to a portion of the resonator conductor portion 1550 near the first end 1550a and to a portion of the resonator conductor portion 1560 near the second end 1560b, with the dielectric layers 140 and 141 interposed between the conductor layer 1407 and each of the aforementioned respective portions of the resonator conductor portions 1550 and 1560. The capacitor C156 shown in FIG. 15 is composed of the conductor layer 1407, the resonator conductor portions 1550 and 1560, and the dielectric layers 140 and 141 interposed between the conductor layer 1407 and the resonator conductor portions 1550 and 1560.

Each of the seven through hole lines 107T of the partition 107 is formed by connecting the through holes 107T1, 107T2, 107T4, 107T5, 107T10, 107T11, 107T12 and 107T13 in series in the Z direction.

In the example shown in FIG. 16 to FIG. 24, the partition 107 extends to pass between the resonator conductor portion 1520 and the resonator conductor portion 1550, and is in contact with the first portion 61 and the second portion 62.

Each of the two through hole lines 108T of the coupling adjustment section 108 is formed by connecting the through holes 108T1, 108T2, 108T4, 108T5, 108T10, 108T11, 108T12 and 108T13 in series in the Z direction.

Each of the plurality of through hole lines 163T of the connecting portion 163 is formed by connecting the through holes 163T1, 163T2, 163T4, 163T5, 163T10, 163T11, 163T12 and 163T13 in series in the Z direction.

In the present embodiment, the resonators 152 and 155 which are not adjacent to each other in circuit configuration are magnetically coupled to each other, while the resonators 151 and 156 which are not adjacent to each other in circuit configuration are capacitively coupled to each other. The resonator 152 and the resonator 151 are adjacent to each other in circuit configuration and are also capacitively coupled to each other. The resonator 155 and the resonator 156 are adjacent to each other in circuit configuration and are also capacitively coupled to each other. The resonator conductor portions 1510, 1520, 1550 and 1560 of the resonators 151, 152, 155 and 156 having such relationships in circuit configuration have the following physical relationships with each other.

The resonator conductor portion 1520 of the resonator 152 and the resonator conductor portion 1550 of the resonator 155 are physically adjacent to each other without any resonator conductor portion of another resonator therebetween. In the present embodiment, in particular, the resonator conductor portion 1520 and the resonator conductor portion 1550, both of which extend in the Y direction, are physically adjacent to each other in the X direction without any resonator conductor portion of another resonator therebetween. The magnetic coupling between the resonators 152 and 155 is thereby achieved.

The resonator conductor portion 1510 of the resonator 151 and the resonator conductor portion 1560 of the resonator 156 are physically adjacent to each other without any resonator conductor portion of another resonator therebetween. In the present embodiment, in particular, the second end 1510b of the resonator conductor portion 1510 and the second end 1560b of the resonator conductor portion 1560 are at a small distance from each other and adjacent to each other, without any resonator conductor portion of another resonator therebetween. The capacitive coupling between the resonators 151 and 156 is thereby achieved.

The resonator conductor portion 1520 of the resonator 152 and the resonator conductor portion 1510 of the resonator 151 are physically adjacent to each other without any resonator conductor portion of another resonator therebetween. The capacitive coupling between the resonators 152 and 151 is thereby achieved easily.

The resonator conductor portion 1550 of the resonator 155 and the resonator conductor portion 1560 of the resonator 156 are physically adjacent to each other without any resonator conductor portion of another resonator therebetween. The capacitive coupling between the resonators 155 and 156 is thereby achieved easily.

The function and effects of the band-pass filter 100 according to the present embodiment will now be described. For example, the band-pass filter 100 is designed and configured to have a passband in a quasi-millimeter wave band of 10 to 30 GHz or a millimeter wave band of 30 to 300 GHz.

In the present embodiment, the partition 107 divides the space defined by the shield 6 into a space in which the resonator conductor portion 1520 is located and a space in which the resonator conductor portion 1550 is located. The present embodiment thus prevents the attenuation characteristic in the frequency region above the passband from being degraded by the lowest-order waveguide mode, like the first embodiment.

Further, in the present embodiment, the second stage resonator 152 and the fifth stage resonator 155, which are not adjacent to each other in circuit configuration, are magnetically coupled to each other. The magnetic coupling between the resonators 152 and 155 enables creation of attenuation poles in both of the first and second passband-vicinity regions in the frequency response of the insertion loss, the first passband-vicinity region being close to the passband and lower than the passband, the second passband-vicinity region being close to the passband and higher than the passband.

In the present embodiment, the first stage resonator 151 and the sixth stage resonator 156, which are not adjacent to each other in circuit configuration, are capacitively coupled to each other. The capacitive coupling between the resonators 151 and 156 has the effect of increasing the insertion loss at the attenuation pole occurring in the first passband-vicinity region. The magnitude of the insertion loss at the attenuation pole occurring in the first passband-vicinity region is adjustable by adjusting the magnitude of the capacitive coupling between the resonators 151 and 156. The coupling adjustment section 108 is provided to adjust the magnitude of the capacitive coupling between the resonators 151 and 156. In other words, the magnitude of the capacitive coupling between the resonators 151 and 156 is adjustable by adjusting the number of and distance between the plurality of through hole lines 108T constituting the coupling adjustment section 108.

The present embodiment achieves such a characteristic that the insertion loss steeply changes in both of the first passband-vicinity region and the second passband-vicinity region, and in particular, achieves such a characteristic that the insertion loss changes more steeply in the first passband-vicinity region than in the second passband-vicinity region.

In the present embodiment, the partition 107 is disposed to pass between the resonator conductor portion 1520 and the resonator conductor portion 1550. The resonator conductor portion 1520 and the resonator conductor portion 1550 respectively constitute the resonator 152 and the resonator 155, which are magnetically coupled to each other although not adjacent to each other in circuit configuration. The magnetic coupling between the resonators 152 and 155 can be weaker than the electromagnetic coupling between any two resonators that are adjacent to each other in circuit configuration. According to the present embodiment, it is thus possible to establish magnetic coupling between the resonators 152 and 155 while disposing the partition 107 to pass between the resonator conductor portion 1520 and the resonator conductor portion 1550. The present embodiment thus achieves both of prevention of deterioration in the attenuation characteristic associated with the lowest-order waveguide mode by the provision of the partition 107 and the creation of attenuation poles by establishing magnetic coupling between the resonators 152 and 155. This results in the favorable characteristics of the band-pass filter 100.

In the present embodiment, the resonator conductor portions 1510, 1520, 1550 and 1560 of the resonators 151, 152, 155 and 156 having the above-described relationship in circuit configuration are configured to have the above-described physical relationship. The present embodiment thus realizes the band-pass filter 100 which has two cross couplings and is simple in structure.

Now, an example of characteristics of the band-pass filter 100 according to the present embodiment and an example of characteristics of a band-pass filter of a second comparative example will be discussed. The band-pass filter of the second comparative example has the same configuration as that of the band-pass filter 100 except that the partition 107 is omitted.

Figure 25:
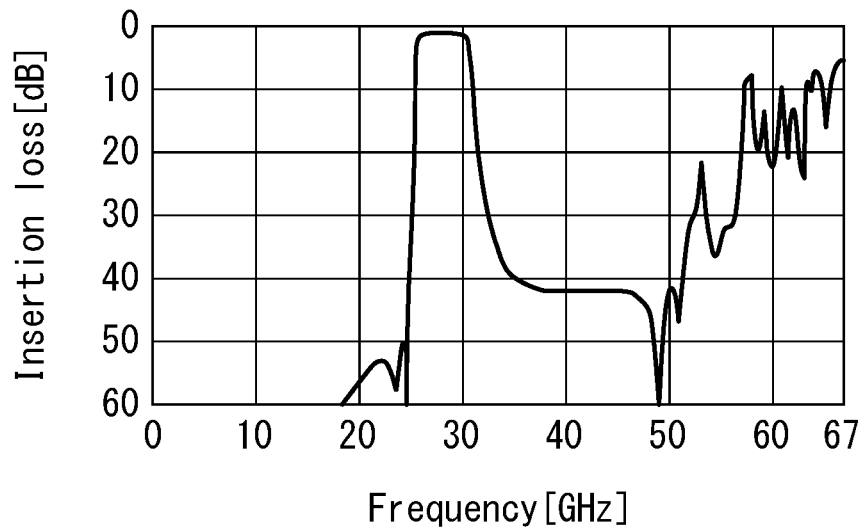
FIG. 25 is a characteristic diagram illustrating an example of the frequency response of the insertion loss of the band-pass filter according to the second embodiment of the invention.
Figure 26:
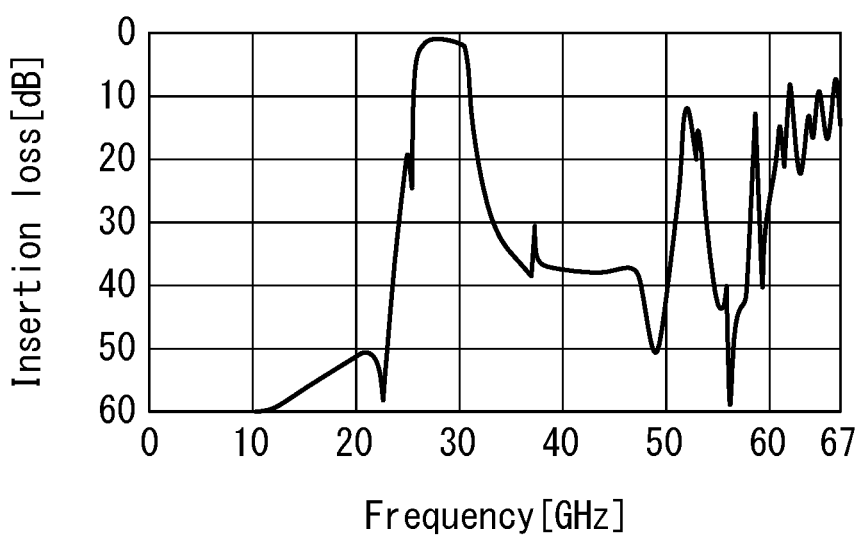
FIG. 26 is a characteristic diagram illustrating an example of the frequency response of the insertion loss of a band-pass filter of a second comparative example.

FIG. 25 illustrates an example frequency response of the insertion loss of the band-pass filter 100 according to the present embodiment. FIG. 26 illustrates an example frequency response of the insertion loss of the band-pass filter of the second comparative example. The frequency responses shown in FIGS. 25 and 26 were obtained by simulation. In FIGS. 25 and 26, the horizontal axis represents frequency, and the vertical axis represents insertion loss. In the examples shown in FIGS. 25 and 26, the band-pass filter 100 and the band-pass filter of the second comparative example have a passband of approximately 26 to 30 GHz, and the center frequency of the passband is approximately 28 GHz.

For the band-pass filter 100 used in the simulation, the magnitudes of the two cross couplings were adjusted, based on the presence of the partition 107, so as to obtain such a characteristic that the insertion loss steeply changes in both of the first passband-vicinity region and the second passband-vicinity region, as shown in FIG. 25. The first passband-vicinity region is a frequency region of approximately 24 to 26 GHz. The second passband-vicinity region is a frequency region of approximately 30 to 32 GHz. Note that the characteristic shown in FIG. 25 exhibits no apparent attenuation pole in the second passband-vicinity region. This is because the capacitive coupling between the resonators 151 and 156 caused a slight reduction in the insertion loss at an attenuation pole that was caused to occur in the second passband-vicinity region by the magnetic coupling between the resonators 152 and 155. Although no apparent attenuation pole is observed in the second passband-vicinity region, the characteristic shown in FIG. 25 exhibits a steep change in the insertion loss in that region.

The characteristic of the band-pass filter of the second comparative example shown in FIG. 26 exhibits a lower insertion loss than that of the band-pass filter 100 in both of the first passband-vicinity region and the second passband-vicinity region. This is because, for the band-pass filter of the second comparative example, the omission of the partition 107 resulted in a deviation of the magnitude of the magnetic coupling between the resonators 152 and 155 from the adjusted magnitude in the band-pass filter 100.

Further, the characteristic of the band-pass filter of the second comparative example shown in FIG. 26 exhibits a peak of an extreme reduction in the insertion loss in a frequency region near 50 GHz. This is considered to be due to unwanted resonance caused by the lowest-order waveguide mode. In the characteristic of the band-pass filter 100 shown in FIG. 25, when compared with the characteristic shown in FIG. 26, the peak present in the frequency region near 50 GHz is shifted to a higher frequency and the insertion loss at this peak is higher. Accordingly, the characteristic shown in FIG. 25 is better than the characteristic shown in FIG. 26 in terms of attenuation characteristic in a frequency region above the passband.

It is apparent from FIG. 25 that the band-pass filter 100 according to the present embodiment provides the favorable characteristics achieving steep changes in the insertion loss in both of the first and second passband-vicinity regions and prevention of deterioration in the attenuation characteristic associated with the lowest-order waveguide mode.

The configuration, operation and effects of the present embodiment are otherwise the same as those of the first embodiment.

Third Embodiment

Figure 27:
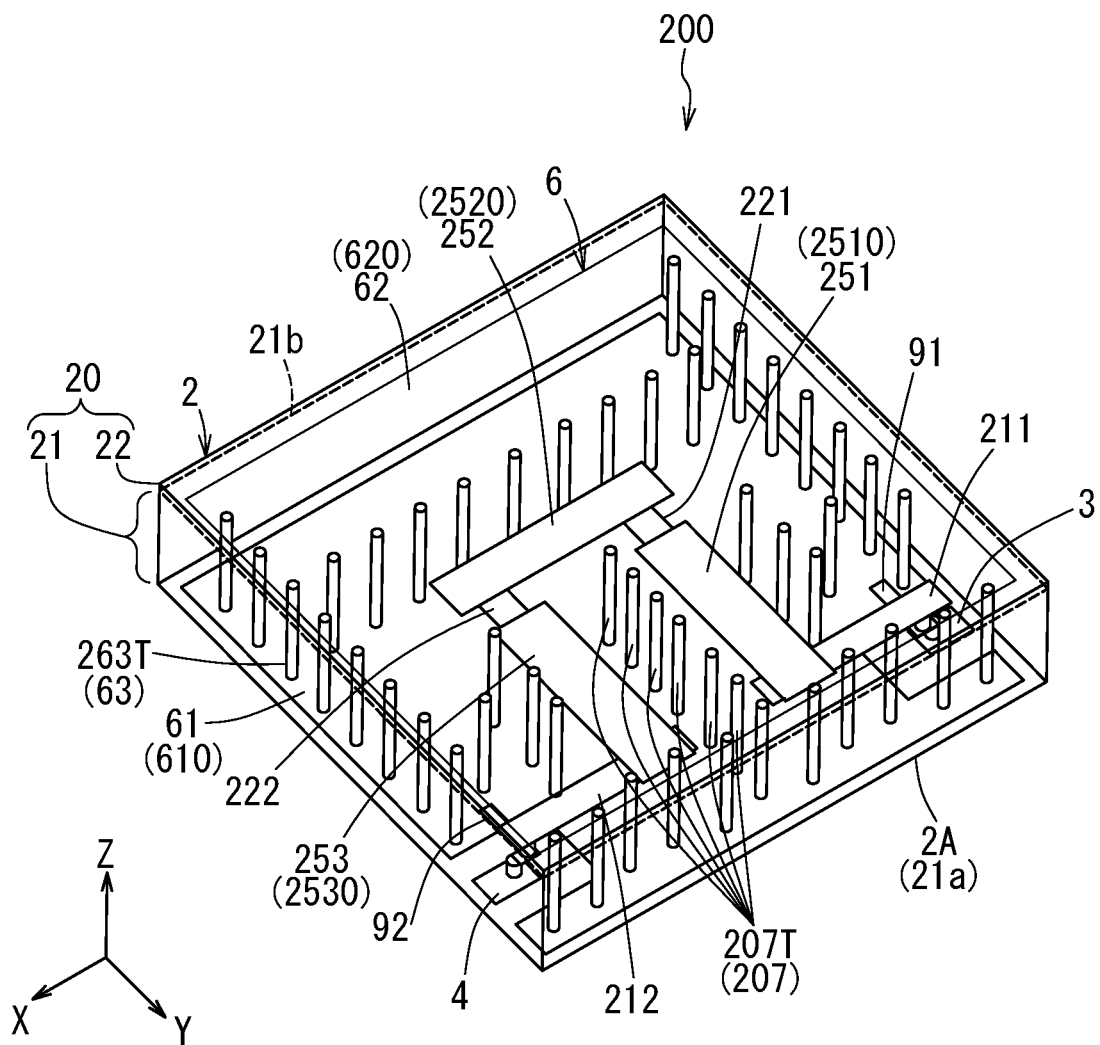
FIG. 27 is a perspective view illustrating the structure of a band-pass filter according to a third embodiment of the invention.
Figure 28:
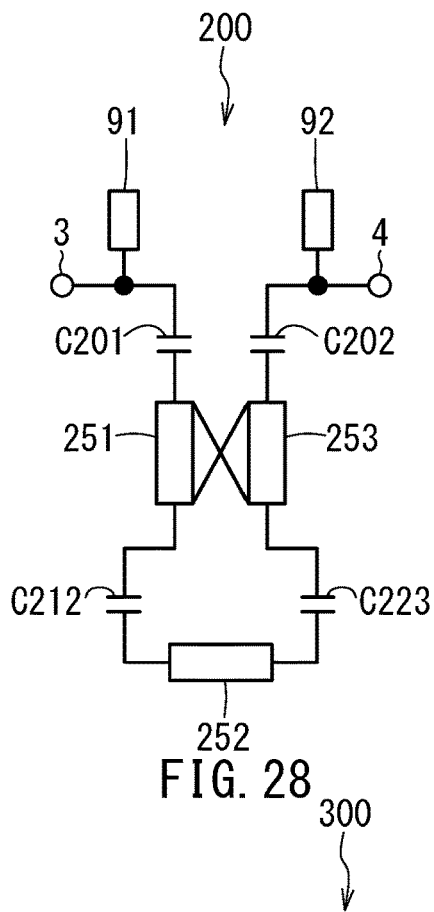
FIG. 28 is a circuit diagram illustrating the circuit configuration of the band-pass filter according to the third embodiment of the invention.

A third embodiment of the present invention will now be described with reference to FIG. 27 and FIG. 28. FIG. 27 is a perspective view illustrating the structure of a band-pass filter according to the third embodiment. FIG. 28 is a circuit diagram illustrating the circuit configuration of the band-pass filter according to the third embodiment.

The band-pass filter 200 according to the present embodiment includes the main body 2, the first input/output port 3, the second input/output port 4, three or more resonators, the shield 6, and a partition 207. The main body 2 includes the multilayer stack 20.

The three or more resonators are located between the first input/output port 3 and the second input/output port 4 in circuit configuration. In the present embodiment, the three or more resonators are three resonators 251, 252 and 253. The three resonators 251, 252 and 253 are arranged in this order, from closest to farthest, from the first input/output port 3 in circuit configuration. The three resonators 251 to 253 are configured so that electromagnetic coupling is established between every two of the resonators adjacent to each other in circuit configuration. Specifically, the resonators 251 to 253 are configured so that the resonators 251 and 252 are adjacent to each other in circuit configuration and are electromagnetically coupled to each other, and the resonators 252 and 253 are adjacent to each other in circuit configuration and are electromagnetically coupled to each other. In the present embodiment, the electromagnetic coupling between every two of the resonators adjacent to each other in circuit configuration is specifically capacitive coupling. In the present embodiment, each of the resonators 251 to 253 is a resonator with open ends, and also a half-wave resonator.

The first portion 61, the second portion 62 and the connecting portion 63 of the shield 6 are arranged to surround the three resonators 251 to 253. The first portion 61 is formed of a first conductor layer 610 disposed on the first end face 21a of the main portion 21 of the multilayer stack 20. The second portion 62 is formed of a second conductor layer 620 disposed on the second end face 21b of the main portion 21 of the multilayer stack 20.

The band-pass filter 200 includes a capacitor C212 for establishing capacitive coupling between the resonators 251 and 252, and a capacitor C223 for establishing capacitive coupling between the resonators 252 and 253.

In the present embodiment, among the three resonators 251 to 253, the resonator 251, which is the closest to the first input/output port 3 in circuit configuration, and the resonator 253, which is the closest to the second input/output port 4 in circuit configuration, are magnetically coupled to each other although they are not adjacent to each other in circuit configuration. The resonator 251 corresponds to the first resonator in the present invention. The resonator 253 corresponds to the second resonator in the present invention.

The band-pass filter 200 further includes a capacitor C201 provided between the first input/output port 3 and the resonator 251, and a capacitor C202 provided between the second input/output port 4 and the resonator 253.

The band-pass filter 200 further includes the two lines 91 and 92 as in the first embodiment.

The resonator 251 includes a resonator conductor portion 2510 formed of a conductor. The resonator 252 includes a resonator conductor portion 2520 formed of a conductor. The resonator 253 includes a resonator conductor portion 2530 formed of a conductor. The resonator conductor portion 2510 corresponds to the first resonator conductor portion in the present invention. The resonator conductor portion 2530 corresponds to the second resonator conductor portion in the present invention.

The resonator conductor portions 2510, 2520 and 2530 are located at the same position in the multilayer stack 20 in the first direction, i.e., the Z direction. Each of the resonator conductor portions 2510, 2520 and 2530 extends in a direction intersecting the first direction or the Z direction. In the present embodiment, specifically, each of the resonator conductor portions 2510, 2520 and 2530 extends in a direction orthogonal to the first direction or the Z direction.

Each of the resonator conductor portions 2510, 2520 and 2530 has a first end and a second end opposite to each other. As mentioned above, each of the resonators 251 to 253 is a resonator with open ends. Thus, both of the first and second ends of each of the resonator conductor portions 2510, 2520 and 2530 are open. Each of the resonator conductor portions 2510, 2520 and 2530 has a length of one half or nearly one half the wavelength corresponding to the center frequency of the passband of the band-pass filter 200.

The partition 207 is in contact with the first portion 61 and the second portion 62. At least part of the partition 207 extends to pass between the resonator conductor portion 2510 and the resonator conductor portion 2530. In the present embodiment, specifically, the partition 207 extends in the first direction, i.e., the Z direction. The partition 207 connects the first portion 61 and the second portion 62 via the shortest path. To be more specific, the length of the partition 207 in the Z direction is equal to the distance between the first portion 61 and the second portion 62.

The partition 207 runs through the two or more dielectric layers constituting the main portion 21. In the present embodiment, the partition 207 includes a plurality of through hole lines 207T each running through the two or more dielectric layers constituting the main portion 21. The plurality of through hole lines 207T correspond to the plurality of first through hole lines in the present invention. In FIG. 27, each through hole line 207T is represented by a circular column. Each of the through hole lines 207T includes two or more through holes connected in series. Each of the through hole lines 207T extends in the Z direction.

In the present embodiment, the resonator conductor portion 2510 and the resonator conductor portion 2530 extend in the Y direction and are adjacent to each other in the X direction with a predetermined spacing therebetween. The through hole lines 207T are arranged to be adjacent to each other in the Y direction and pass between the resonator conductor portions 2510 and 2530. In the present embodiment, the number of the through hole lines 207T is six.

The connecting portion 63 of the shield 6 includes a plurality of through hole lines 263T each running through the two or more dielectric layers constituting the main portion 21. The plurality of through hole lines 263T correspond to the second through hole lines in the present invention. In FIG. 27, each through hole line 263T is represented by a circular column. All the through hole lines represented by circular columns in FIG. 27, except the six through hole lines 207T, are the through hole lines 263T. Each of the through hole lines 263T includes two or more through holes connected in series. Each of the through hole lines 263T extends in the Z direction.

The band-pass filter 200 further includes conductor layers 211, 212, 221 and 222 provided inside the multilayer stack 20.

The conductor layer 211 has a first end and a second end opposite to each other. A portion of the conductor layer 211 near the first end thereof is connected to the first input/output port 3 via a plurality of through holes provided in the multilayer stack 20. A portion of the conductor layer 211 near the second end thereof is opposed to a portion of the resonator conductor portion 2510 near the first end thereof with one or more dielectric layers interposed therebetween. The capacitor C201 is thereby formed. The line 91 is connected to the first input/output port 3 via one or more of the through holes connecting the conductor layer 211 and the first input/output port 3.

The conductor layer 212 has a first end and a second end opposite to each other. A portion of the conductor layer 212 near the first end thereof is connected to the second input/output port 4 via a plurality of through holes provided in the multilayer stack 20. A portion of the conductor layer 212 near the second end thereof is opposed to a portion of the resonator conductor portion 2530 near the first end thereof with one or more dielectric layers interposed therebetween. The capacitor C202 is thereby formed. The line 92 is connected to the second input/output port 4 via one or more of the through holes connecting the conductor layer 212 and the second input/output port 4.

The conductor layer 221 is opposed to a portion of the resonator conductor portion 2510 near the second end thereof and to a portion of the resonator conductor portion 2520 near the first end thereof with one or more dielectric layers interposed between the conductor layer 221 and each of the aforementioned respective portions of the resonator conductor portions 2510 and 2520. The capacitor C212 is thereby formed.

The conductor layer 222 is opposed to a portion of the resonator conductor portion 2520 near the second end thereof and to a portion of the resonator conductor portion 2530 near the second end thereof with one or more dielectric layers interposed between the conductor layer 222 and each of the aforementioned respective portions of the resonator conductor portions 2520 and 2530. The capacitor C223 is thereby formed.

In the present embodiment, the partition 207 divides the space defined by the shield 6 into a space in which the resonator conductor portion 2510 is located and a space in which the resonator conductor portion 2530 is located. The present embodiment thus prevents the attenuation characteristic in the frequency region above the passband from being degraded by the lowest-order waveguide mode, like the first embodiment.

Further, in the present embodiment, the first stage resonator 251 and the third stage resonator 253, which are not adjacent to each other in circuit configuration, are magnetically coupled to each other. The magnetic coupling between the resonators 251 and 253 enables creation of an attenuation pole in the first passband-vicinity region, which is a frequency region close to the passband and lower than the passband, in the frequency response of the insertion loss.

By virtue of the above features, the band-pass filter 200 according to the present embodiment provides the favorable characteristics achieving steep changes in the insertion loss in the first passband-vicinity region and prevention of deterioration in the attenuation characteristic associated with the lowest-order waveguide mode.

The configuration, operation and effects of the present embodiment are otherwise the same as those of the first embodiment.

Fourth Embodiment

Figure 29:
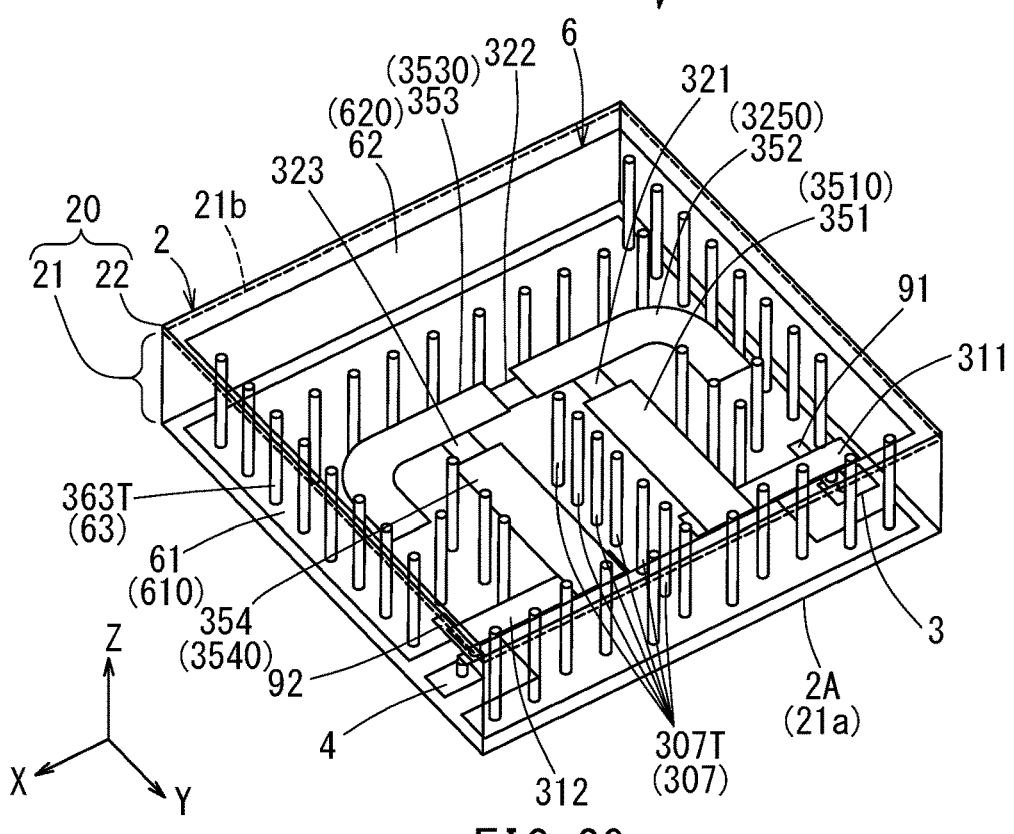
FIG. 29 is a perspective view illustrating the structure of a band-pass filter according to a fourth embodiment of the invention.
Figure 30:
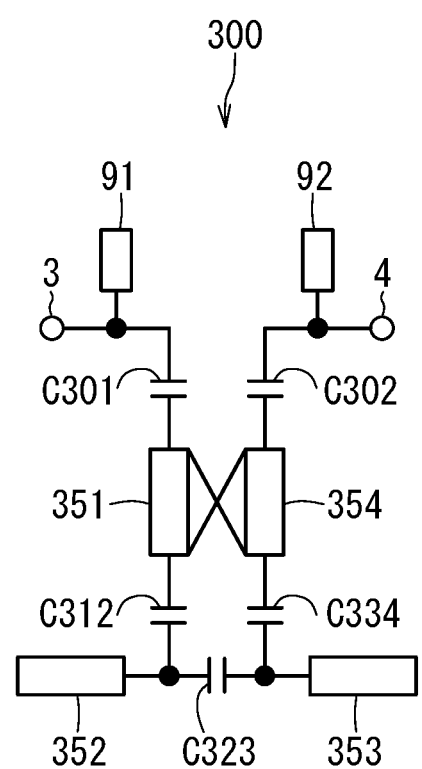
FIG. 30 is a circuit diagram illustrating the circuit configuration of the band-pass filter according to the fourth embodiment of the invention.

A fourth embodiment of the present invention will now be described with reference to FIG. 29 and FIG. 30. FIG. 29 is a perspective view illustrating the structure of a band-pass filter according to the fourth embodiment. FIG. 30 is a circuit diagram illustrating the circuit configuration of the band-pass filter according to the fourth embodiment.

The band-pass filter 300 according to the present embodiment includes the main body 2, the first input/output port 3, the second input/output port 4, three or more resonators, the shield 6, and a partition 307. The main body 2 includes the multilayer stack 20.

The three or more resonators are located between the first input/output port 3 and the second input/output port 4 in circuit configuration. In the present embodiment, the three or more resonators are four resonators 351, 352, 353 and 354. The four resonators 351, 352, 353 and 354 are arranged in this order, from closest to farthest, from the first input/output port 3 in circuit configuration. The four resonators 351 to 354 are configured so that electromagnetic coupling is established between every two of the resonators adjacent to each other in circuit configuration. Specifically, the resonators 351 to 354 are configured so that the resonators 351 and 352 are adjacent to each other in circuit configuration and are electromagnetically coupled to each other, the resonators 352 and 353 are adjacent to each other in circuit configuration and are electromagnetically coupled to each other, and the resonators 353 and 354 are adjacent to each other in circuit configuration and are electromagnetically coupled to each other. In the present embodiment, the electromagnetic coupling between every two of the resonators adjacent to each other in circuit configuration is specifically capacitive coupling. In the present embodiment, each of the resonators 351 to 354 is a resonator with open ends, and also a half-wave resonator.

The first portion 61, the second portion 62 and the connecting portion 63 of the shield 6 are arranged to surround the four resonators 351 to 354. The first portion 61 is formed of the first conductor layer 610 disposed on the first end face 21a of the main portion 21 of the multilayer stack 20. The second portion 62 is formed of the second conductor layer 620 disposed on the second end face 21b of the main portion 21 of the multilayer stack 20.

The band-pass filter 300 includes a capacitor C312 for establishing capacitive coupling between the resonators 351 and 352, a capacitor C323 for establishing capacitive coupling between the resonators 352 and 353, and a capacitor C334 for establishing capacitive coupling between the resonators 353 and 354.

In the present embodiment, among the four resonators 351 to 354, the resonator 351, which is the closest to the first input/output port 3 in circuit configuration, and the resonator 354, which is the closest to the second input/output port 4 in circuit configuration, are magnetically coupled to each other although they are not adjacent to each other in circuit configuration. The resonator 351 corresponds to the first resonator in the present invention. The resonator 354 corresponds to the second resonator in the present invention.

The band-pass filter 300 further includes a capacitor C301 provided between the first input/output port 3 and the resonator 351, and a capacitor C302 provided between the second input/output port 4 and the resonator 354.

The band-pass filter 300 further includes the two lines 91 and 92 as in the first embodiment.

The resonator 351 includes a resonator conductor portion 3510 formed of a conductor. The resonator 352 includes a resonator conductor portion 3520 formed of a conductor. The resonator 353 includes a resonator conductor portion 3530 formed of a conductor. The resonator 354 includes a resonator conductor portion 3540 formed of a conductor. The resonator conductor portion 3510 corresponds to the first resonator conductor portion in the present invention. The resonator conductor portion 3540 corresponds to the second resonator conductor portion in the present invention.

The resonator conductor portions 3510, 3520, 3530 and 3540 are located at the same position in the multilayer stack 20 in the first direction, i.e., the Z direction. Each of the resonator conductor portions 3510, 3520, 3530 and 3540 extends in a direction intersecting the first direction or the Z direction. In the present embodiment, specifically, each of the resonator conductor portions 3510, 3520, 3530 and 3540 extends in a direction orthogonal to the first direction or the Z direction.

Each of the resonator conductor portions 3510, 3520, 3530 and 3540 has a first end and a second end opposite to each other. As mentioned above, each of the resonators 351 to 354 is a resonator with open ends. Thus, both of the first and second ends of each of the resonator conductor portions 3510, 3520, 3530 and 3540 are open. Each of the resonator conductor portions 3510, 3520, 3530 and 3540 has a length of one half or nearly one half the wavelength corresponding to the center frequency of the passband of the band-pass filter 300.

The partition 307 is in contact with the first portion 61 and the second portion 62. At least part of the partition 307 extends to pass between the resonator conductor portion 3510 and the resonator conductor portion 3540. In the present embodiment, specifically, the partition 307 extends in the first direction, i.e., the Z direction. The partition 307 connects the first portion 61 and the second portion 62 via the shortest path. To be more specific, the length of the partition 307 in the Z direction is equal to the distance between the first portion 61 and the second portion 62.

The partition 307 runs through the two or more dielectric layers constituting the main portion 21. In the present embodiment, the partition 307 includes a plurality of through hole lines 307T each running through the two or more dielectric layers constituting the main portion 21. The plurality of through hole lines 307T correspond to the plurality of first through hole lines in the present invention. In FIG. 29, each through hole line 307T is represented by a circular column. Each of the through hole lines 307T includes two or more through holes connected in series. Each of the through hole lines 307T extends in the Z direction.

In the present embodiment, the resonator conductor portion 3510 and the resonator conductor portion 3540 extend in the Y direction and are adjacent to each other in the X direction with a predetermined spacing therebetween. The through hole lines 307T are arranged to be adjacent to each other in the Y direction and pass between the resonator conductor portions 3510 and 3540. In the present embodiment, the number of the through hole lines 307T is six.

The connecting portion 63 of the shield 6 includes a plurality of through hole lines 363T each running through the two or more dielectric layers constituting the main portion 21. The plurality of through hole lines 363T correspond to the second through hole lines in the present invention. In FIG. 29, each through hole line 363T is represented by a circular column. All the through hole lines represented by circular columns in FIG. 29, except the six through hole lines 307T, are the through hole lines 363T. Each of the through hole lines 363T includes two or more through holes connected in series. Each of the through hole lines 363T extends in the Z direction.

The band-pass filter 300 further includes conductor layers 311, 312, 321, 322 and 323 provided inside the multilayer stack 20.

The conductor layer 311 has a first end and a second end opposite to each other. A portion of the conductor layer 311 near the first end thereof is connected to the first input/output port 3 via a plurality of through holes provided in the multilayer stack 20. A portion of the conductor layer 311 near the second end thereof is opposed to a portion of the resonator conductor portion 3510 near the first end thereof with one or more dielectric layers interposed therebetween. The capacitor C301 is thereby formed. The line 91 is connected to the first input/output port 3 via one or more of the through holes connecting the conductor layer 311 and the first input/output port 3.

The conductor layer 312 has a first end and a second end opposite to each other. A portion of the conductor layer 312 near the first end thereof is connected to the second input/output port 4 via a plurality of through holes provided in the multilayer stack 20. A portion of the conductor layer 312 near the second end thereof is opposed to a portion of the resonator conductor portion 3540 near the first end thereof with one or more dielectric layers interposed therebetween. The capacitor C302 is thereby formed. The line 92 is connected to the second input/output port 4 via one or more of the through holes connecting the conductor layer 312 and the second input/output port 4.

The conductor layer 321 is opposed to a portion of the resonator conductor portion 3510 near the second end thereof and to a portion of the resonator conductor portion 3520 near the first end thereof with one or more dielectric layers interposed between the conductor layer 321 and each of the aforementioned respective portions of the resonator conductor portions 3510 and 3520. The capacitor C312 is thereby formed.

The conductor layer 322 is opposed to a portion of the resonator conductor portion 3520 near the first end thereof and to a portion of the resonator conductor portion 3530 near the first end thereof with one or more dielectric layers interposed between the conductor layer 322 and each of the aforementioned respective portions of the resonator conductor portions 3520 and 3530. The capacitor C323 is thereby formed.

The conductor layer 323 is opposed to a portion of the resonator conductor portion 3530 near the first end thereof and to a portion of the resonator conductor portion 3540 near the second end thereof with one or more dielectric layers interposed between the conductor layer 323 and each of the aforementioned respective portions of the resonator conductor portions 3530 and 3540. The capacitor C334 is thereby formed.

In the present embodiment, the partition 307 divides the space defined by the shield 6 into a space in which the resonator conductor portion 3510 is located and a space in which the resonator conductor portion 3540 is located. The present embodiment thus prevents the attenuation characteristic in the frequency region above the passband from being degraded by the lowest-order waveguide mode, as does the first embodiment.

In the present embodiment, the first stage resonator 351 and the fourth stage resonator 354, which are not adjacent to each other in circuit configuration, are magnetically coupled to each other. The magnetic coupling between the resonators 351 and 354 enables creation of attenuation poles in both of the first and second passband-vicinity regions in the frequency response of the insertion loss, the first passband-vicinity region being close to the passband and lower than the passband, the second passband-vicinity region being close to the passband and higher than the passband.

By virtue of the above features, the band-pass filter 300 according to the present embodiment provides the favorable characteristics achieving steep changes in the insertion loss in both of the first and second passband-vicinity regions and prevention of deterioration in the attenuation characteristic associated with the lowest-order waveguide mode.

The configuration, operation and effects of the present embodiment are otherwise the same as those of the first embodiment.

The present invention is not limited to the foregoing embodiments, and various modifications may be made thereto. For example, the number and the configuration of the resonators are not limited to those illustrated in the foregoing embodiments, and can be freely chosen as far as the requirements of the appended claims are met. Further, at least part of the connecting portion of the shield 6 may be composed of conductor layer(s) formed on one or more side surfaces of the main body 2, instead of a plurality of through hole lines. Still further, the partition may be composed of plate-shaped conductor portions, instead of a plurality of through hole lines.

Obviously, many modifications and variations of the present invention are possible in the light of the above teachings. Thus, it is to be understood that, within the scope of the appended claims and equivalents thereof, the invention may be practiced in other embodiments than the foregoing most preferable embodiments.

What is claimed is:

1. A band-pass filter comprising:
a main body formed of a dielectric;
a first input/output port and a second input/output port integrated with the main body;
three or more resonators provided within the main body, located between the first input/output port and the second input/output port in circuit configuration, and configured so that electromagnetic coupling is established between every two of the resonators adjacent to each other in circuit configuration;
a shield formed of a conductor and integrated with the main body; and
a partition formed of a conductor, provided within the main body, and electrically connected to the shield, wherein:
the shield includes a first portion and a second portion spaced from each other in a first direction, and a connecting portion connecting the first and second portions,
the first portion, the second portion and the connecting portion are arranged to surround the three or more resonators,
the three or more resonators include a first resonator and a second resonator that are configured to be magnetically coupled to each other although not adjacent to each other in circuit configuration,
the first resonator includes a first resonator conductor portion formed of a conductor,
the second resonator includes a second resonator conductor portion formed of a conductor,
each of the first and second resonator conductor portions extends in a direction intersecting the first direction,
the partition is in contact with the first portion and the second portion,
at least part of the partition extends to pass between the first resonator conductor portion and the second resonator conductor portion, and
each of the three or more resonators is a resonator with open ends.

2. The band-pass filter according to claim 1, wherein the electromagnetic coupling between every two of the resonators adjacent to each other in circuit configuration is capacitive coupling.

3. The band-pass filter according to claim 1, further comprising a notch filter section for attenuating a signal of a predetermined frequency higher than a passband of the band-pass filter.

4. The band-pass filter according to claim 1, wherein the partition extends in the first direction and connects the first portion and the second portion via a shortest path.

5. The band-pass filter according to claim 1, wherein
the first resonator is a resonator that is the closest to the first input/output port in circuit configuration, and
the second resonator is a resonator that is the closest to the second input/output port in circuit configuration.

6. The band-pass filter according to claim 5, wherein the three or more resonators are five resonators.

7. The band-pass filter according to claim 1, wherein
the first resonator is a resonator that is the second closest to the first input/output port in circuit configuration, and
the second resonator is a resonator that is the second closest to the second input/output port in circuit configuration.

8. The band-pass filter according to claim 7, wherein the three or more resonators are six resonators.

9. A band-pass filter comprising:
a main body formed of a dielectric;
a first input/output port and a second input/output port integrated with the main body;
three or more resonators provided within the main body, located between the first input/output port and the second input/output port in circuit configuration, and configured so that electromagnetic coupling is established between every two of the resonators adjacent to each other in circuit configuration;
a shield formed of a conductor and integrated with the main body; and
a partition formed of a conductor, provided within the main body, and electrically connected to the shield, wherein:
the shield includes a first portion and a second portion spaced from each other in a first direction, and a connecting portion connecting the first and second portions,
the first portion, the second portion and the connecting portion are arranged to surround the three or more resonators,
the three or more resonators include a first resonator and a second resonator that are configured to be magnetically coupled to each other although not adjacent to each other in circuit configuration,
the first resonator includes a first resonator conductor portion formed of a conductor,
the second resonator includes a second resonator conductor portion formed of a conductor,
each of the first and second resonator conductor portions extends in a direction intersecting the first direction,
at least part of the partition extends to pass between the first resonator conductor portion and the second resonator conductor portion,
the main body includes a multilayer stack composed of a plurality of dielectric layers stacked together in the first direction,
the first resonator conductor portion and the second resonator conductor portion are located at the same position in the multilayer stack in the first direction, and
the partition extends through two or more dielectric layers stacked together, among the plurality of dielectric layers, and is in contact with the first portion and the second portion.

10. The band-pass filter according to claim 9, further comprising a notch filter section for attenuating a signal of a predetermined frequency higher than a passband of the band-pass filter.

11. The band-pass filter according to claim 9, wherein
the multilayer stack includes a main portion composed of the two or more dielectric layers,
the main portion has a first end face and a second end face located at opposite ends in the first direction,
the first portion is formed of a first conductor layer disposed on the first end face, and
the second portion is formed of a second conductor layer disposed on the second end face.

12. The band-pass filter according to claim 11, wherein
the partition includes a plurality of first through hole lines each running through the two or more dielectric layers, and
each of the plurality of first through hole lines includes two or more through holes connected in series.

13. The band-pass filter according to claim 11, wherein
the connecting portion of the shield includes a plurality of second through hole lines each running through the two or more dielectric layers, and
each of the plurality of second through hole lines includes two or more through holes connected in series.

14. The band-pass filter according to claim 9, wherein
the first resonator is a resonator that is the second closest to the first input/output port in circuit configuration, and
the second resonator is a resonator that is the second closest to the second input/output port in circuit configuration.

15. The band-pass filter according to claim 14, wherein the three or more resonators are six resonators.

16. The band-pass filter according to claim 9, wherein each of the three or more resonators is a resonator with open ends.

17. The band-pass filter according to claim 9, wherein the partition extends in the first direction and connects the first portion and the second portion via a shortest path.

18. The band-pass filter according to claim 9, wherein
the first resonator is a resonator that is the closest to the first input/output port in circuit configuration, and
the second resonator is a resonator that is the closest to the second input/output port in circuit configuration.

19. The band-pass filter according to claim 18, wherein the three or more resonators are five resonators.

20. The band-pass filter according to claim 9, wherein the electromagnetic coupling between every two of the resonators adjacent to each other in circuit configuration is capacitive coupling.

* * * * *